United States Patent
Naito et al.

(10) Patent No.: US 7,687,284 B2
(45) Date of Patent: Mar. 30, 2010

(54) MAGNETIC SENSOR AND MANUFACTURING METHOD THEREFOR

(75) Inventors: Hiroshi Naito, Aira-gun (JP); Hideki Sato, Hamamatsu (JP); Hiroaki Fukami, Aira-gun (JP); Syuusei Takami, Aira-gun (JP)

(73) Assignee: Yamaha Corporation, Shizuoka-ken (JP)

( * ) Notice: Subject to any disclaimer, the term of this patent is extended or adjusted under 35 U.S.C. 154(b) by 914 days.

(21) Appl. No.: 11/328,255

(22) Filed: Jan. 10, 2006

(65) Prior Publication Data
US 2006/0176142 A1 Aug. 10, 2006

(30) Foreign Application Priority Data

| Jan. 13, 2005 | (JP) | ............................ P2005-006341 |
| Mar. 17, 2005 | (JP) | ............................ P2005-077011 |
| Mar. 29, 2005 | (JP) | ............................ 2005-096087 |
| Aug. 31, 2005 | (JP) | ............................ 2005-250616 |

(51) Int. Cl.
*H01L 21/00* (2006.01)
*G01R 33/09* (2006.01)

(52) U.S. Cl. ..................... 438/3; 257/E43.001; 324/252

(58) Field of Classification Search ............ 324/207.21, 324/249, 252; 29/603.16, 603.18; 438/14, 438/3; 360/324, 324.1, 324.11, 324.12, 326; 365/8; 257/E43.001
See application file for complete search history.

(56) References Cited

U.S. PATENT DOCUMENTS

| 4,385,975 A | * | 5/1983 | Chu et al. .................... 438/427 |
| 6,344,951 B1 | * | 2/2002 | Sato et al. .................... 360/316 |
| 2008/0169807 A1 | * | 7/2008 | Naito et al. .................. 324/252 |

FOREIGN PATENT DOCUMENTS

| EP | 1 411 365 A2 | 4/2004 |
| JP | 11-305055 A | 11/1999 |
| JP | 2002-299728 A | 10/2002 |
| JP | 3498737 B2 | 12/2003 |
| JP | 2004-006752 | 1/2004 |
| JP | 2004-12156 A | 1/2004 |
| JP | 2004-193540 A | 7/2004 |

* cited by examiner

*Primary Examiner*—Bot L LeDynh
(74) *Attorney, Agent, or Firm*—Dickstein Shapiro LLP

(57) ABSTRACT

A small-size magnetic sensor comprises three axial sensors each configured using plural giant magnetoresistive elements, wherein an X-axis sensor and a Y-axis sensor are arranged on the planar surface of an embedded layer of a substrate, and giant magnetoresistive elements forming a Z-axis sensor are formed on slopes of projections, which are formed by etching the embedded layer. It is possible to form an elongated projection on a substrate by way of the high-density plasma CVD method or by way of plasma etching and microwave etching, so that giant magnetoresistive elements are formed on the slopes of the elongated projection.

3 Claims, 19 Drawing Sheets

MAGNETIC SENSOR AND MANUFACTURING METHOD THEREFOR

BACKGROUND OF THE INVENTION

1. Field of the Invention

The present invention relates to magnetic sensors in which three or more giant magnetoresistive elements are arranged on a single substrate so as to detect three axial values regarding the intensity of a magnetic field applied thereto with respect to three axial directions. The present invention also relates to manufacturing methods for magnetic sensors whose dimensions are reduced.

The present application claims priority on Japanese Patent Applications Nos. 2005-6341, 2005-96087, 2005-77011, and 2005-250616, the contents of which are incorporated herein by reference.

2. Description of the Related Art

Japanese Unexamined Patent Application Publication No. 2004-6752 discloses a magnetic sensor in which three or more giant magnetoresistive elements (referred to as GMR elements) are arranged on a single substrate so as to measure three axial values regarding the intensity of a magnetic field applied thereto with respect to three axial directions.

The aforementioned magnetic sensor has reduced dimensions in which giant magnetoresistive elements for use in measurement of a magnetic field in X-axis and Y-axis directions are arranged on a planar surface of a silicon substrate, and another giant magnetoresistive element for use in measurement of the magnetic field in a Z-axis direction is arranged on a slope of a projection formed on the silicon substrate.

It is possible to design a three-axial magnetic sensor in which giant magnetoresistive elements for use in measurement of a magnetic field in X-axis and Y-axis directions are arranged on a planar surface of a substrate, and another giant magnetoresistive element for use in measurement of the magnetic field in a Z-axis direction is arranged on a slope of an elongated projection composed of silicon oxide, which is formed on the substrate.

SUMMARY OF THE INVENTION

It is an object of the invention to provide a small-size magnetic sensor in which three or more giant magnetoresistive elements are arranged on a single substrate so as to detect three axial values regarding the intensity of a magnetic field applied thereto with respect to three axial directions.

In a first aspect of the present invention, a magnetic sensor is produced in such a way that at least one magnetoresistive element is formed on a slope of an elongated projection having a linear ridgeline on a substrate so as to realize a sensing direction perpendicular to the substrate.

In a second aspect of the present invention, a magnetic sensor is produced in such a way that a magnetoresistive element is formed on a slope of an elongated projection having a linear ridgeline, which is formed on top of an insulating layer including a step forming portion on a substrate.

In a third aspect of the present invention, a magnetic sensor is produced in such a way that at least one magnetoresistive element is formed on a slope of an elongated projection having a linear ridgeline, which is formed on top of an insulating layer including a step forming portion on a substrate, and two or more magnetoresistive elements are formed on a planar surface of the substrate, wherein the magnetoresistive element formed on the slope of the elongated projection realizes a sensing direction perpendicular to the substrate, and the other magnetoresistive elements realize a sensing direction parallel to the substrate.

In a fourth aspect of the present invention, a magnetic sensor is produced in such a way that a plurality of giant magnetoresistive elements, each of which includes a plurality of magneto-sensitive elements electrically connected in series by way of a bias magnet, are formed on slopes of elongated projections having linear ridgelines, which are formed in parallel with each other on a substrate, and two or more giant magnetoresistive elements are formed on a planar surface of the substrate.

In a fifth aspect of the present invention, the aforementioned magneto-sensitive element is formed on a middle portion of the slope of the elongated projection and is constituted by a band-like member whose longitudinal direction substantially matches the ridgeline. In addition, a via is formed in the substrate and is connected to the bias magnet by way of a wiring layer, which is configured using a magnet film for use in the formation of the bias magnet, wherein a giant magnetoresistive film for use in the formation of the magneto-sensitive element is deposited on the magnet film with respect to the via. Furthermore, a pinning direction of the magneto-sensitive element forms an angle ranging from 30° to 60° with respect to a longitudinal direction of the magneto-sensitive element included in the giant magnetoresistive element.

In a sixth aspect of the present invention, a magnetic sensor is produced in accordance with a manufacturing method including a first step for forming a step forming portion, which projects upwardly from a substrate; a second step for depositing silicon oxide on the step forming portion by way of a high-density plasma CVD method, thus forming an elongated projection having a linear ridgeline above the step forming portion; and a third step for forming a magnetoresistive element on a slope of the elongated projection. It is possible to form two or more elongated projections having linear ridgelines to be adjacent to each other on the substrate. The elongated projection has a trapezoidal shape or a triangular shape in a longitudinal cross section thereof. It is possible to form another magnetoresistive element on the planar surface of the substrate in addition to the aforementioned magnetoresistive element formed on the slope of the elongated projection.

The aforementioned manufacturing method can be modified to include a first step for forming a step forming portion, which projects upwardly from a substrate; a second step for depositing an insulating layer on the substrate so as to entirely cover the step forming portion, thus forming an elongated projection that is shaped in conformity with the step forming portion; a third step for processing the elongated projection to have slopes by way of plasma etching or microwave etching, thus making the elongated projection have slopes and a linear ridgeline; and a fourth step for forming a magnetoresistive element on the slope of the elongated projection.

In a seventh aspect of the present invention, a magnetic sensor is produced in accordance with a manufacturing method including a first step for forming a thick layer on a substrate; a second step for forming a resist layer on the thick layer; a third step for removing a prescribed part of the resist layer; a fourth step for subjecting the remaining part of the resist layer to heat treatment, thus forming slopes; and a fifth step for etching the remaining part of the resist layer and the thick layer with a ratio of 1:1, thus forming an elongated projection having a linear ridgeline.

In an eighth aspect of the present invention, a magnetic sensor is produced in accordance with a manufacturing method including a first step for forming a planation layer so as to entirely cover an uppermost wiring layer of a substrate; a second step for forming a passivation layer on the planation layer; a third step for forming a thick layer on the planation layer; a fourth step for forming a resist layer on the thick layer; a fifth step for removing a prescribed part of the resist layer; a sixth step for subjecting the remaining part of the resist layer to heat treatment, thus forming slopes; a seventh step for etching the remaining part of the resist layer and the thick layer with a ratio of 1:1, thus forming an elongated projection having a linear ridgeline; an eighth step for forming a bias magnet film to cover a planar surface of the thick layer and the slopes of the elongated projection as well as its bottom and top portions; a ninth step for forming a giant magnetoresistive film on the bias magnet film; a tenth step for subjecting the substrate, which is placed on a magnet array, to heat treatment; an eleventh step for removing a prescribed part of the giant magnetoresistive film by way of etching; a twelfth step for forming a plurality of magneto-sensitive elements on the planar surface of the thick layer and the slopes of the elongated projection respectively; and a thirteenth step for further forming a protection layer.

The aforementioned manufacturing method can be modified to include a first step for forming a planation layer to cover an uppermost wiring layer on a substrate; a second step for removing a prescribed part of the planation layer so as to expose a via and a pad; a third step for forming a passivation layer including an upper layer and a lower layer; a fourth step for removing the upper layer with respect to the via and the pad; a fifth step for forming a thick layer; a sixth step for forming a resist layer; a seventh step for removing a prescribed part of the resist layer; an eighth step for subjecting the remaining part of the resist layer to heat treatment, thus forming slopes; a ninth step for etching the remaining part of the resist layer and the thick layer with a ratio of 1:1, thus forming an elongated projection having a linear ridgeline, while the thick layer, which is reduced in thickness, remains in the via and the pad; a tenth step for removing the thick layer and the lower layer of the passivation layer from the via, thus exposing a conductive portion of the via; an eleventh step for forming a bias magnet film to cover a planar surface of the thick layer and the slopes of the elongated projection as well as its top and bottom portions; a twelfth step for forming a wiring layer so as to establish an electric connection between the bias magnet film and the conductive portion of the via; a thirteenth step for forming a giant magnetoresistive film in connection with the bias magnet film; a fourteenth step for subjecting the substrate, which is placed on a magnet array, to heat treatment; a fifteenth step for removing a prescribed part of the giant magnetoresistive film by way of etching, thus forming a plurality of magneto-sensitive elements on the planar surface of the thick layer and the slopes of the elongated projection, wherein the giant magnetoresistive film still remains in the via; a sixteenth step for forming a protection layer to entirely cover the substrate except the pad; and a seventeenth step for removing the thick layer covering the pad and the lower layer of the passivation layer, thus exposing a conductive portion of the pad.

As described above, the present invention provides a small-size three axial magnetic sensor in which giant magnetoresistive elements for detecting three axial values regarding the intensity of a magnetic field in X-axis, Y-axis, and Z-axis directions are formed on a single substrate. Magneto-sensitive elements included in giant magnetoresistive elements reformed on the slopes of the elongated projections in prescribed areas having good planarity, thus improving performance of the magnetic sensor. Due to the formation of the giant magnetoresistive film on the wiring layer, composed of the magnet film, in proximity to the opening of the via, it is possible to reduce the likelihood of breaking of the wiring layer at corners of the step forming portion. In addition, it is possible to improve the stability in which giant magnetoresistive elements can be restored to initial state even when they are placed in a high magnetic field.

The aforementioned magnetic sensor is produced in accordance with a sophisticated process in which giant magnetoresistive elements having band-like shapes can be sequentially formed on the slopes of an elongated projection having a linear ridgeline on a substrate. In addition, it is possible to sequentially form the elongated projection, giant magnetoresistive elements, via, and pad on the substrate.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

The present invention will be described in further detail by way of examples with reference to the accompanying drawings.

1. First Embodiment

Figure 1:
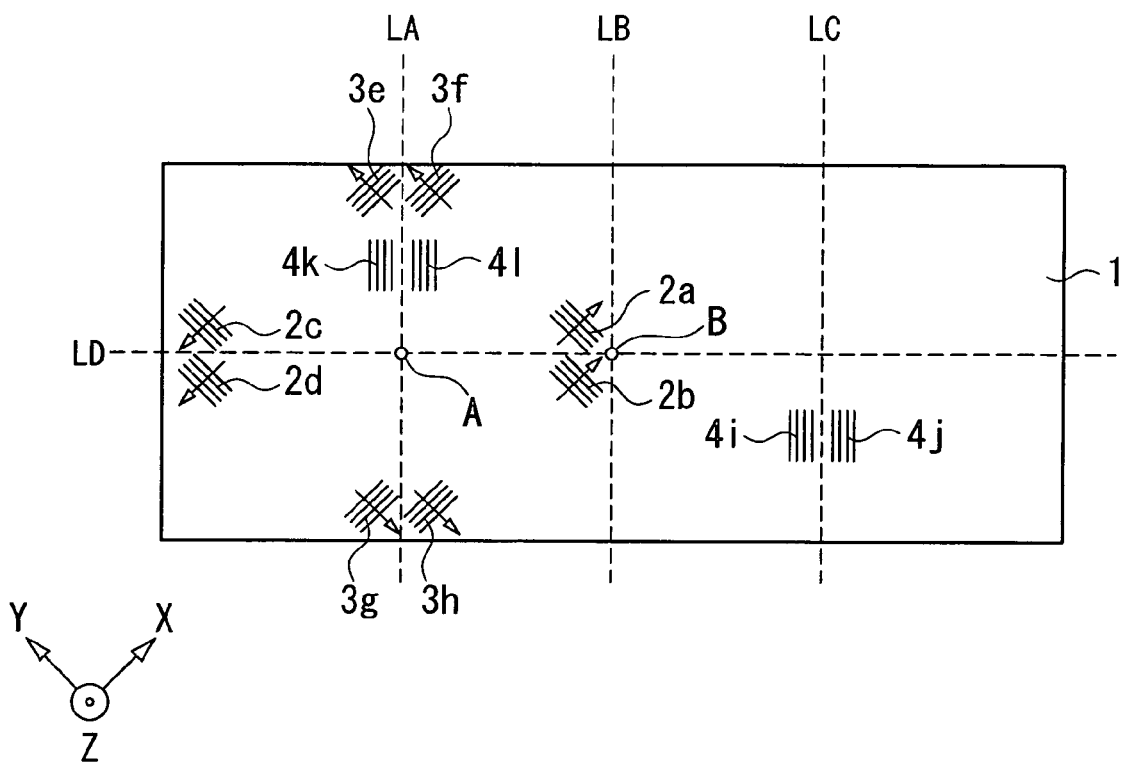
FIG. 1 is a plan view showing the overall layout of three axial sensors, i.e., an X-axis sensor, a Y-axis sensor, and a Z-axis sensor, all of which are configured using giant magnetoresistive elements formed on a substrate for use in a magnetic sensor in accordance with a first embodiment of the present invention.

FIG. 1 diagrammatically shows a magnetic sensor in accordance with a first embodiment of the present invention, in which a plurality of giant magnetoresistive elements are arranged on a substrate.

In FIG. 1, reference numeral 1 designates a semiconductor substrate composed of silicon, which includes a drive circuit for a magnetic sensor, a semiconductor integrated circuit such as a signal processing circuit, and a wiring layer, all of which are formed in advance. In addition, a planation layer, a passivation layer, and an embedded layer composed of silicon oxide are sequentially formed on the substrate 1. None of the aforementioned circuits and layers is illustrated in FIG. 1.

An X-axis sensor 2, a Y-axis sensor 3, and a Z-axis sensor 4 are arranged on the embedded layer. In a three-axial coordinates system adapted to the magnetic sensor of FIG. 1, the X-axis sensor 2 is sensitive to an X-axis component of a magnetic field; the Y-axis sensor 3 is sensitive to a Y-axis component of the magnetic field; and the Z-axis sensor 4 is sensitive to a Z-axis component of the magnetic field.

Specifically, the X-axis sensor 2 is constituted by four giant magnetoresistive elements 2a, 2b, 2c, and 2d; the Y-axis sensor 3 is constituted by four giant magnetoresistive elements 3e, 3f, 3g, and 3h; and the Z-axis sensor 4 is constituted by four giant magnetoresistive elements 4i, 4j, 4k, and 4l. Both the X-axis sensor 2 and the Y-axis sensor 3 are arranged on the planar surface of the embedded layer; and the Z-axis sensor 4 is arranged on slopes of projections, which are formed on the embedded layer.

Within the four giant magnetoresistive elements 2a to 2d forming the X-axis sensor 2, the giant magnetoresistive elements 2a and 2b are arranged adjacent to each other in a center area of the substrate 1, and the other giant magnetoresistive elements 2c and 2d are arranged adjacent to each other in a side-end area, which is distant from the center area of the substrate 1, whereby a pair of the giant magnetoresistive elements 2c and 2d are arranged opposite to a pair of the giant magnetoresistive elements 2a and 2b.

Within the four giant magnetoresistive elements 3e to 3h forming the Y-axis sensor 3, the giant magnetoresistive elements 3e and 3f are arranged adjacent to each other in proximity to a terminal end of the substrate 1, and the other giant magnetoresistive element 3g and 3h are arranged adjacent to each other in proximity to an opposite terminal end of the substrate 1, whereby a pair of the giant magnetoresistive elements 3e and 3f are arranged opposite to a pair of the giant magnetoresistive elements 3g and 3h.

Within the four giant magnetoresistive elements 4i to 4l forming the Z-axis sensor 4, the giant magnetoresistive elements 4k and 4l are arranged adjacent to each other in proximity to the giant magnetoresistive elements 3e and 3f, and the other giant magnetoresistive element 4i and 4j are arranged adjacent to each other and are slightly distant from the giant magnetoresistive elements 2a and 2b.

The aforementioned giant magnetoresistive elements forming the X-axis sensor 2, Y-axis sensor 3, and Z-axis sensor are respectively arranged in accordance with the following rule.

In FIG. 1, dotted lines LA, LB, and LC are imaginary lines for dividing the substrate 1 into four sections in a longitudinal direction; and a dotted line LD is an imaginary line for dividing the substrate 1 into two sections in a width direction. In addition, the lines LA and LD intersect each other at an intersection point A; and the lines LB and LD intersect each other at an intersection point B.

As to the X-axis sensor 2, the giant magnetoresistive elements 2a and 2b are positioned symmetrical to the giant magnetoresistive elements 2c and 2d with respect to the intersection point A. As to the Y-axis sensor 3, the giant magnetoresistive elements 3e and 3f are positioned symmetrical to the giant magnetoresistive elements 3g and 3h with respect to the intersection point A. As to the Z-axis sensor 4, the giant magnetoresistive elements 4i and 4j are positioned symmetrical to the giant magnetoresistive elements 4k and 4l with respect to the intersection point B.

Figure 3:
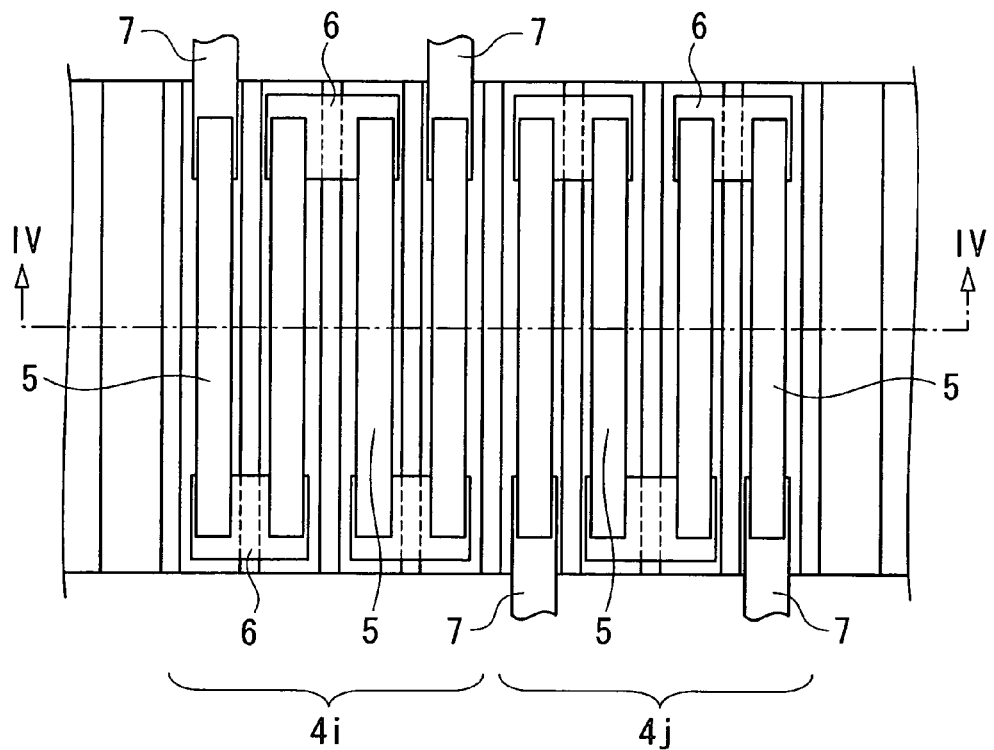
FIG. 3 is a plan view diagrammatically showing two giant magnetoresistive elements included in the Z-axis sensor.

All of the aforementioned giant magnetoresistive elements are basically configured similarly to those conventionally known. In the present embodiment, as shown in FIG. 3, each giant magnetoresistive element is constituted by four magneto-sensitive elements 5 and three bias magnets 6 for electrically connecting the magneto-sensitive elements 5 in series.

The magneto-sensitive elements 5 form the main portion of a giant magnetoresistive element and are each formed in a slender band-like shape having a planar surface, and they are arranged such that longitudinal directions thereof match ridgeline directions of projections, which will be described later.

Each magneto-sensitive element 5 has a pinned layer whose magnetization direction is fixed to a prescribed direction, and a free layer whose magnetization direction varies in response to a directivity of an external magnetic field. Specifically, it is configured in the form of a multi-layered thin metal deposition in which a conductive space layer, a pinned layer, and a capping layer are sequentially deposited on a free layer.

For example, the free layer is formed in a three-layered structure including a amorphous magnetic layer composed of cobalt-zirconium-niobium, a magnetic layer composed of nickel-iron, and a magnetic layer composed of cobalt-iron; the spacer layer is composed of copper; the pinned layer is formed in a two-layered structure including a ferromagnetic layer composed of cobalt-iron and an antiferromagnetic layer composed of platinum-manganese; and the capping layer is composed of tantalum.

The three bias magnets 6 are used to electrically connect the four magneto-sensitive elements 5 in series and to apply a bias magnetic field for adjusting magnetic characteristics of the magneto-sensitive elements 5. Each bias magnet 6 is configured in the form of a thin-metal deposition of a two-layered structure having a cobalt-platinum-chromium layer and a chromium layer.

Figure 2:
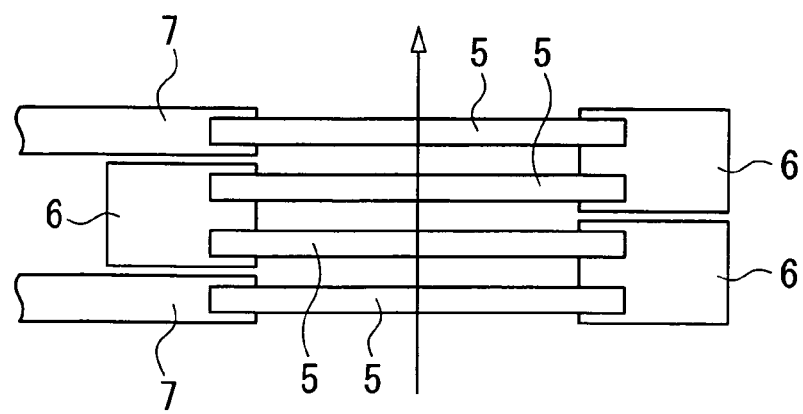
FIG. 2 is a plan view diagrammatically showing the detailed configuration of a giant magnetoresistive element.

Each of the giant magnetoresistive elements 2a, 2b, 2c, 2d, 3e, 3f, 3g, and 3h forming the X-axis sensor 2 and the Y-axis sensor 3, which are arranged on the planar surface of the substrate 1, is configured by four magneto-sensitive elements 5 and three bias magnets 6 as shown in FIG. 2, wherein wiring layers 7 are connected to the outermost magneto-sensitive elements 5, which are not connected to the bias magnets 6, and are further connected to vias (not shown).

Figure 4:
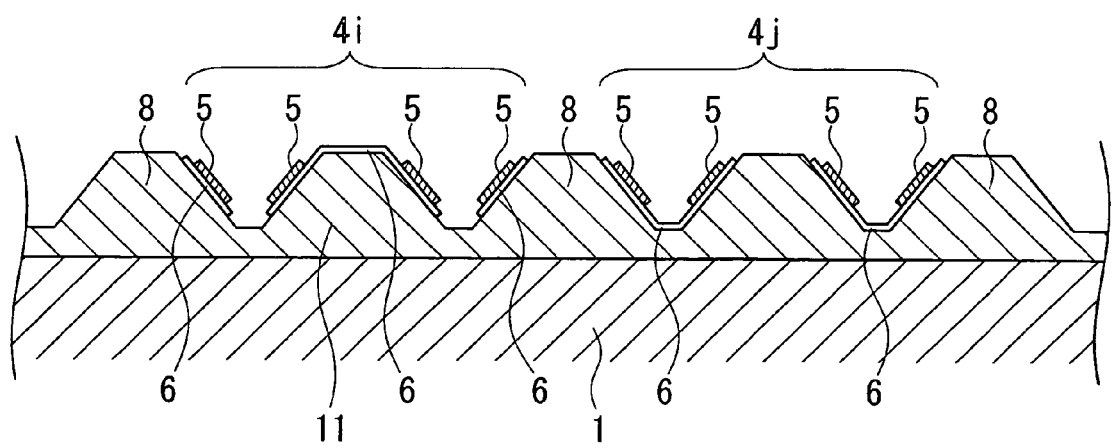
FIG. 4 is a cross-sectional view taken along line IV-IV in FIG. 3.
Figure 5:
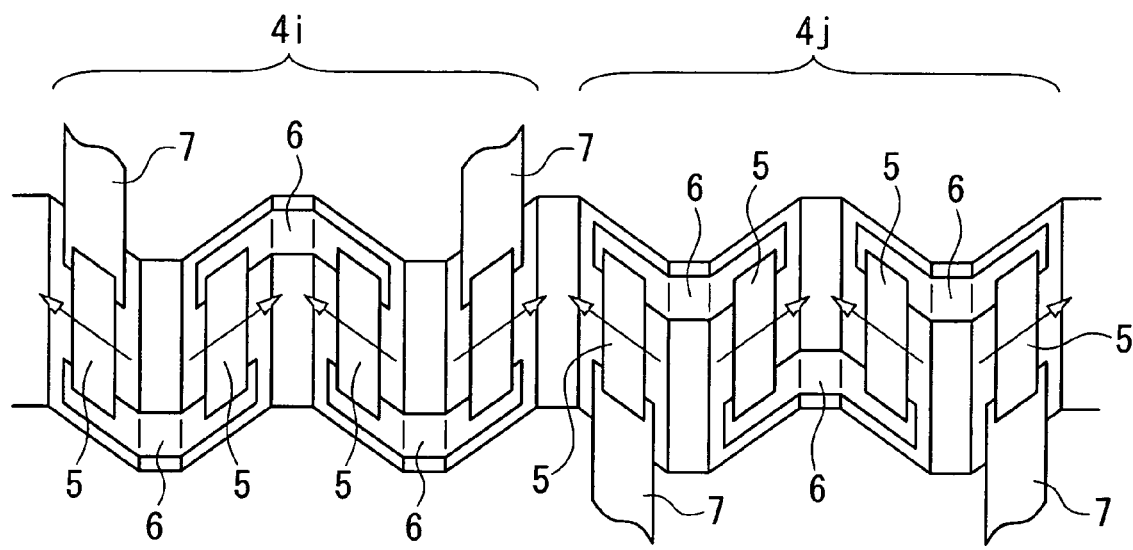
FIG. 5 is a perspective view showing the arrangement of the two giant magnetoresistive elements included in the Z-axis sensor.

FIGS. 3 to 5 show details of the giant magnetoresistive elements 4i and 4j within the four giant magnetoresistive elements 4i, 4j, 4k, and 4l forming the Z-axis sensor 4; and the other giant magnetoresistive elements 4k and 4l are each configured similarly to the giant magnetoresistive elements 4i and 4j and are not specifically described and illustrated in the present embodiment.

FIG. 3 is a plan view diagrammatically showing the giant magnetoresistive elements 4i and 4j; FIG. 4 is a cross-sectional view taken along line IV-IV in FIG. 3; and FIG. 5 is a perspective view diagrammatically showing the arrangement of magneto-sensitive elements 5, bias magnets 6, and wiring layers 7 forming the giant magnetoresistive elements 4i and 4j.

As shown in FIG. 4, reference numeral 11 designates an embedded layer composed of silicon oxide, which is deposited on a substrate 1.

The embedded layer 11 has five projections 8 having linear ridgelines, which are formed in parallel with each other.

The projections 8 have the ridgelines, which are substantially formed in line in a plan view with respect to slopes thereof for arranging giant magnetoresistive elements; hence, each projection 8 can be designed to have a planar top portion on the ridgeline thereof.

Each projection 8 is formed in a mountain-like shape or a bank-like shape, wherein dimensions thereof are set in such a way that the height thereof ranges from 3 μm to 8 μm, the length thereof ranges from 200 μm to 400 μm, and the width of a slope thereof ranges from 3 μm to 16 μm. In addition, an angle formed between the slope of the projection 8 and the surface of the embedded layer 11 ranges from 30° to 80°, and it is preferably set to 70°.

FIG. 4 is illustrated such that each projection 8 has "flattened" slopes; in the actuality of manufacturing, each slope may be curved and slightly protrude towards the exterior (i.e., the upper side of the substrate 1).

The aforementioned five projections 8 shown in FIG. 4 provide eight "adjacently-arranged" slopes for arranging magneto-sensitive elements 5 of eight giant magnetoresistive elements, all of which are positioned on center portions of the slopes having good planarity.

Within the eight slopes that adjoin each other with respect to the projections 8, a terminal end of a magneto-sensitive element 5 formed on a first slope is electrically connected to a terminal end of another magneto-sensitive element 5 formed on a second slope, which adjoins the first slope via a bottom between the projections 8, by way of a bias magnet 6. In addition, another terminal end of the magneto-sensitive element 5 formed on the second slope is electrically connected to a terminal end of a magneto-sensitive element 5 formed on a third slope, which adjoins the second slope via a top portion of the projection 8, by way of a bias magnet 6.

As described above, four magneto-sensitive elements 5 are connected in series via three bias magnets 6, thus forming a giant magnetoresistive element 4i.

Similarly, four magneto-sensitive elements 5 are connected in series via three bias magnets 6, thus forming a giant magnetoresistive element 4j.

Similar to the X-axis sensor 2 and the Y-axis sensor 3 both formed on the planar surface of the embedded layer 11, the Z-axis sensor 4 is designed using magnetoresistive elements, in which two wiring layers 7 are connected to terminals of two outermost magneto-sensitive elements 5 within four magneto-sensitive elements 5 and are further connected to vias (not shown). In the present embodiment, the two wiring layers 7 are formed using magnet films of the bias magnet 6 included in the giant magnetoresistive element; thus, it is possible to simultaneously produce the bias magnet 6 and the wiring layers 7.

With respect to each of the X-axis sensor 2 and the Y-axis sensor 3, a sensing axis (see an arrow in FIG. 2) is set to be perpendicular to the longitudinal direction of the magneto-sensitive elements 5 and in parallel with the surface of the substrate 1. In addition, the pinning direction of the magneto-sensitive element 5 and the magnetization direction of a bias magnetic field caused by the bias magnet 6 are each set to be in parallel with the surface of the substrate 1, wherein both the pinning direction and the magnetization direction form an angle ranging from 30° to 60° (preferably, an angle of 45°) with respect to the longitudinal direction of the magneto-sensitive elements 5.

With respect to the giant magnetoresistive elements 4i and 4j included in the Z-axis sensor 4, as shown in FIG. 5, sensing directions are set to be perpendicular to the longitudinal directions of the magneto-sensitive elements 5 and in parallel with the slopes of the projections 8, wherein they are directed upwards along the slopes. In addition, the pinning direction of the magneto-sensitive element 5 and the magnetization direction of a bias magnetic field caused by the bias magnet 6 are each directed upwards along the slopes and in parallel with the slopes of the projections 8, wherein both the pinning direction and the magnetization direction form an angle ranging from 30° to 60° (preferably, an angle of 45°) with respect to the longitudinal direction of the magneto-sensitive elements 5.

Figure 6:
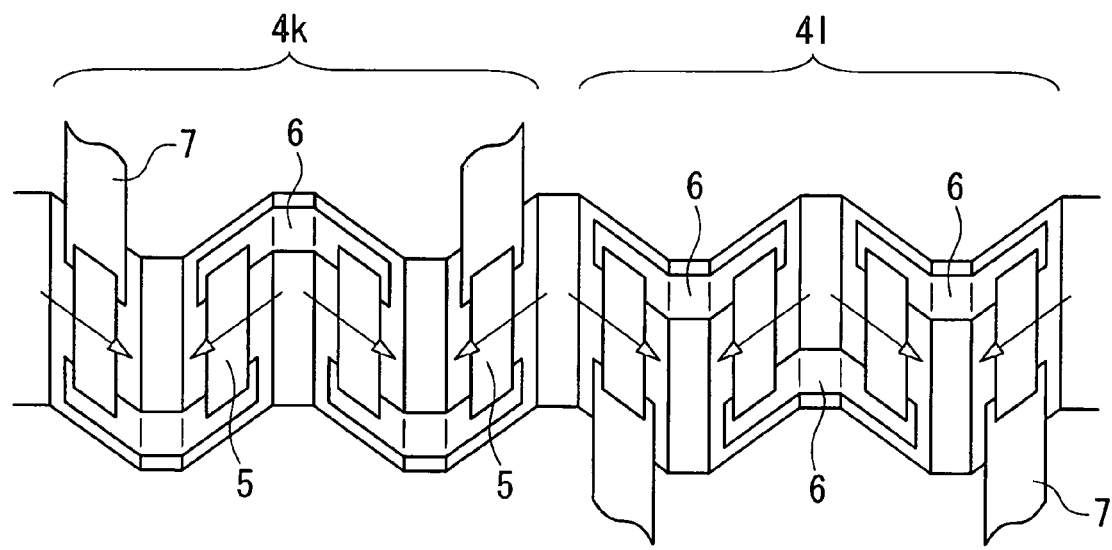
FIG. 6 is a perspective view showing the arrangement of two other giant magnetoresistive elements included in the Z-axis sensor.

With respect to the giant magnetoresistive elements 4k and 4l included in the Z-axis sensor 4, as shown in FIG. 6, sensing directions are set to be perpendicular to the longitudinal directions of the magneto-sensitive elements 5 and in parallel with the slopes of the projections 8, wherein they are directed downwards along the slopes. In addition, the pinning direction of the magneto-sensitive element 5 and the magnetization direction of a bias magnetic field caused by the bias magnet 6 are each directed downwards along the slopes and in parallel with the slopes of the projections 8, wherein both the pinning direction and the magnetization direction form an angle ranging from 30° to 60° (preferably, an angle of 45°) with respect to the longitudinal direction of the magneto-sensitive elements 5.

In order to realize the aforementioned sensing directions, a magnet array is placed just above and in proximity to a substrate, which is then subjected to heat treatment for three to five hours at a prescribed temperature ranging from 260° C. to 290° C. This is similar to the conventionally-known pinning process.

Normally, both the sensing direction and pinning direction adapted to a giant magnetoresistive element are set to be perpendicular to the longitudinal direction of the magneto-sensitive element 5 and in parallel with the surface of the substrate 1. In contrast, the present embodiments make the sensing direction and pinning direction differ from each other, thus improving the stability of the giant magnetoresistive elements.

Figure 7A:
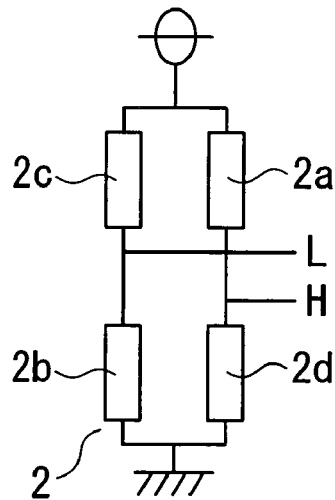
FIG. 7A is a simple circuit diagram showing an electric connection between four giant magnetoresistive elements included in the X-axis sensor.
Figure 7B:
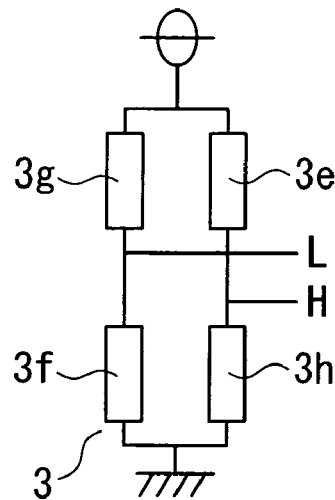
FIG. 7B is a simple circuit diagram showing an electric connection between four giant magnetoresistive elements included in the Y-axis sensor.
Figure 7C:
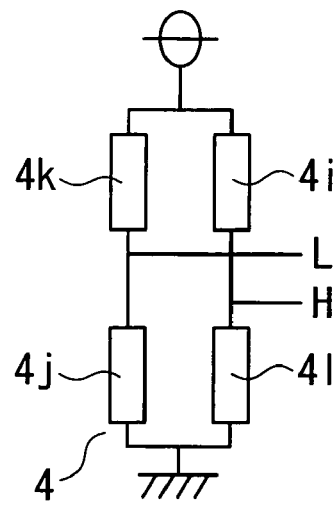
FIG. 7C is a simple circuit diagram showing an electric connection between four giant magnetoresistive elements included in the Z-axis sensor.

FIG. 7A shows an electric connection between the four giant magnetoresistive elements 2a, 2b, 2c, and 2d with respect to the X-axis sensor 2; FIG. 7B shows an electric connection between the four giant magnetoresistive elements 3e, 3f, 3g, and 3h with respect to the Y-axis sensor 3; and FIG. 7C shows an electric connection between the four giant magnetoresistive elements 4i, 4j, 4k, and 4l with respect to the Z-axis sensor 4. In each of the aforementioned sensors 2, 3, and 4, the giant four magnetoresistive elements are subjected to a bridge connection.

Due to the bridge connection between the giant magnetoresistive elements, it is possible to increase the outputs of the X-axis sensor 2, Y-axis sensor 3, and Z-axis sensor 4 when a magnetic field is applied in directions lying in the X-axis, Y-axis, and Z-axis respectively. When a magnetic field is applied in reverse directions, it is possible to reduce the outputs of the X-axis sensor 2, Y-axis sensor 3, and Z-axis sensor 4 respectively.

FIGS. 1 to 6 do not include illustrations regarding a passivation layer composed of silicon nitride and a protection layer composed of polyimide, which are formed on the surface of the substrate 1 so as to entirely cover all the giant magnetoresistive elements included in the X-axis sensor 2, Y-axis sensor 3, and Z-axis sensor 4, which are thus protected from external environment.

Figure 8:
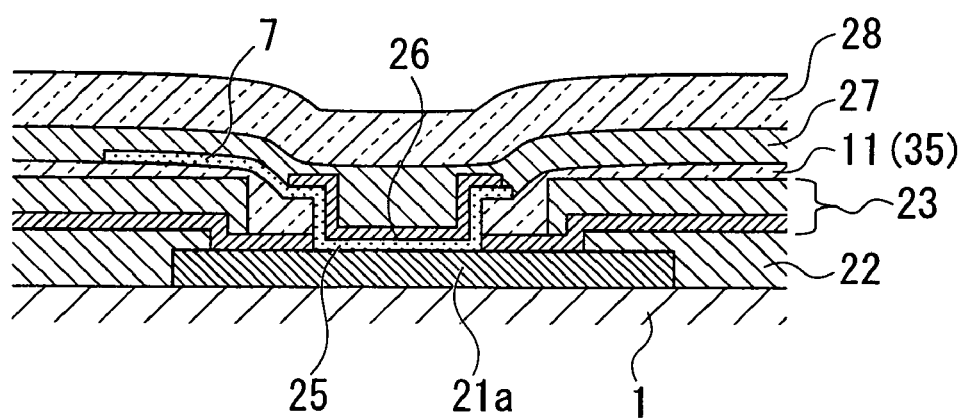
FIG. 8 is a cross-sectional view showing the structure of a via formed in the substrate.

FIG. 8 shows a structure of a via formed at a prescribed position of the substrate 1, wherein reference numeral 21a designates a conductive portion composed of aluminum, which forms a part of the via. The conductive portion 21a is electrically connected to a wiring layer formed thereunder.

The peripheral area of the surface of the conductive portion 21a is covered with a planation layer 22 and a first passivation layer 23 as well as the aforementioned embedded layer 11. The terminal portion of the embedded layer 11 forms a slope as shown in FIG. 8.

The center area of the surface of the conductive portion 21a is covered with a wiring layer 25, which is connected to the wiring layer 7 of the aforementioned magnetoresistive element. Similar to the wiring layer 7, the wiring layer 25 is formed using magnet films of the bias magnets 6; hence, it can be formed simultaneously with the bias magnets 6.

The wiring layer 25 has a step-like portion, which is formed at the terminal end of the embedded layer 11. At the corner of the step-like portion, the thickness of the wiring layer 25 is reduced, and this may likely cause a break during processing. For this reason, a protective conduction layer 26 is deposited to cover the step-like portion and center portion of the wiring layer 25.

In the present embodiment, a giant magnetoresistive film, which forms the magneto-sensitive elements 5 of a giant magnetoresistive element, is used as the protective conduction layer 26. This makes it possible to realize the deposition of the protective conduction layer 26 on the wiring layer 25 simultaneously with the formation of the magneto-sensitive members 5. Thus, it is possible to avoid the occurrence of breaking of the wiring layer 25.

The aforementioned via is further covered with a passivation layer 27 composed of silicon nitride and a protection layer 28 composed of polyimide, by which it is protected from external environment.

In the magnetic sensor of the present embodiment, three axial sensors, i.e., the X-axis sensor 2, Y-axis sensor 3, and Z-axis sensor 4, are formed on a single substrate 1. That is, the present embodiment serves as a small-size three axial magnetic sensor. All the magneto-sensitive elements of the giant magnetoresistive elements are formed on the slopes of the projections 8 having good planarity; hence, it is possible to produce a magnetic sensor having good performance in sensing.

With respect to the opening of a via and its surrounding areas, the protective conduction layer 26, which is formed using the giant magnetoresistive film of the giant magnetoresistive element, is deposited on the wiring layer 25, which is formed using the magnet film of the bias magnet 6. This greatly reduces the likelihood of occurrence of the breaking of the wiring layer 25 at the corner of the step-like portion.

In addition, the pinning direction of the magneto-sensitive element 5 forms an angle ranging from 30° to 60° with respect to the longitudinal direction of the magneto-sensitive element 5. This greatly improves the stability in which giant magnetoresistive elements are restored to initial state even when they are placed in a high magnetic field.

It may be possible to produce a magnetic sensor having a Z-axis sensor in which plural channels are formed in a thick film composed of silicon oxide on a substrate, so that giant magnetoresistive elements are formed in the slopes of the channels. However, this magnetic sensor has a drawback in that the thick film remains on the overall surface of the substrate, which is thus exposed to relatively high stress. In contrast, the magnetic sensor of the present embodiment is advantageous in that the embedded layer 11 whose thickness is reduced remains on the overall surface of the substrate 1 except the areas of the projections 8, and stress applied to the substrate 1 can be greatly reduced. In addition, the present embodiment realizes a reduction of the step-like portion that is formed between the foregoing layers with respect to the opening of a via and its surrounding areas. This greatly reduces the likelihood of occurrence of breaking of the wiring layer 25 in proximity to the step-like portion.

Next, a manufacturing method for the aforementioned magnetic sensor will be described.

The following description is given mainly with respect to the formation of a via and the formation of a pad as well as the formation of giant magnetoresistive elements of the Z-axis sensor 4 on the slopes of the projections 8.

First, there is prepared a substrate 1 in which a drive circuit of a magnetic sensor, a semiconductor integrated circuit such as a signal processing circuit, and wiring layers are formed in advance on a semiconductor substrate composed of silicon.

Figure 9A:
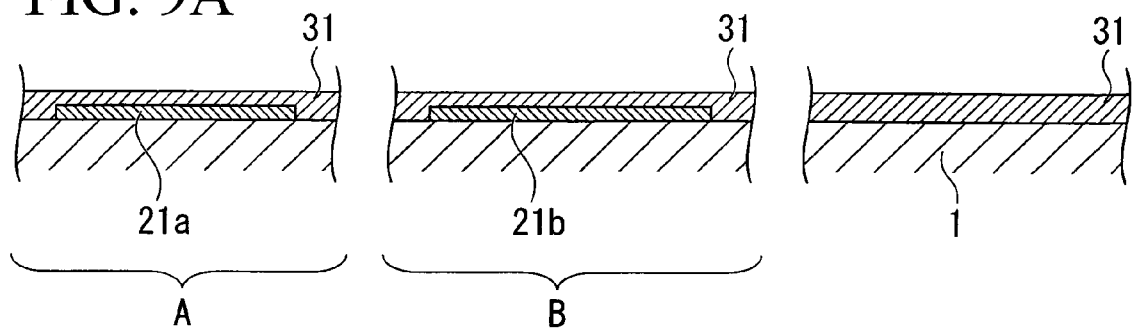
FIG. 9A is a cross-sectional view showing the processing of a via, a pad, and a projection forming area on a substrate in accordance with a first step of manufacturing of a magnetic sensor.

FIG. 9A shows a part of an uppermost wiring layer on the substrate 1, in which a via A has a conductive portion 21a composed of aluminum, and a pad B has a conductive portion 21b composed of aluminum.

First, a planation layer 31 is formed on the substrate 1. The planation layer 31 is configured by sequentially depositing a silicon oxide film of 300 nm thickness formed by the plasma CVD (chemical vapor deposition) method, a SOG film of 600 nm thickness, and a silicon oxide film of 50 nm thickness composed of ethoxy-silane, for example.

Figure 9B:
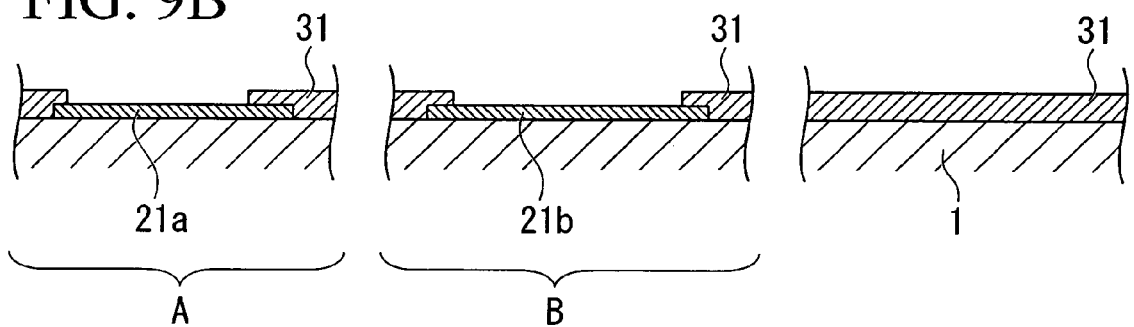
FIG. 9B is a cross-sectional view showing the processing of the via, pad, and projecting forming area in a second step of manufacturing of the magnetic sensor.
Figure 9C:
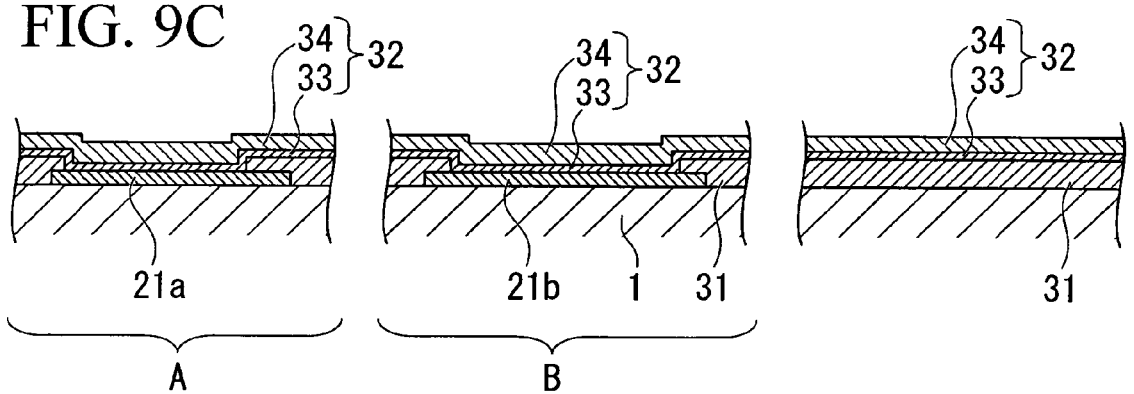
FIG. 9C is a cross-sectional view showing the processing of the via, pad, and projection forming area in a third step of manufacturing of the magnetic sensor.

Next, as shown in FIG. 9B, the planation layer 31 above the conductive portion 21a of the via A and the conductive portion 21b of the pad B are removed by etching; thus, both the conductive portions 21a and 21b are exposed. Then, as shown in FIG. 9C, a first passivation layer 32 (or 23, see FIG. 8) is formed to entirely cover the overall surface of the substrate 1. The first passivation layer 32 is formed by sequentially depositing a silicon oxide film 33 of 250 nm thickness formed by the plasma CVD method and a silicon nitride film 34 of 600 nm thickness formed by the plasma CVD method, for example.

Figure 9D:
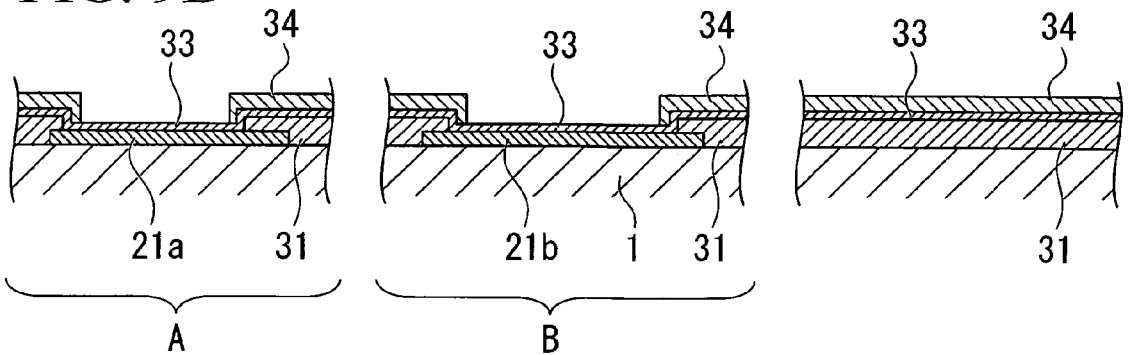
FIG. 9D is a cross-sectional view showing the processing of the via, pad, and projection forming area in a fourth step of manufacturing of the magnetic sensor.

Next, as shown in FIG. 9D, the silicon nitride film 34 deposited above the conductive portion 21a of the via A and the conductive portion 21b of the pad B are removed by etching. Herein, etching is performed in such a way that the silicon oxide film 33 is not removed, and the removed area of the silicon nitride film 34 is made smaller than an opening width of the planation film 31. This prevents the water content from infiltrating into the wiring layer and the semiconductor integrated circuit because the terminal portion of the planation layer 31 is not exposed to the exterior.

Figure 10A:
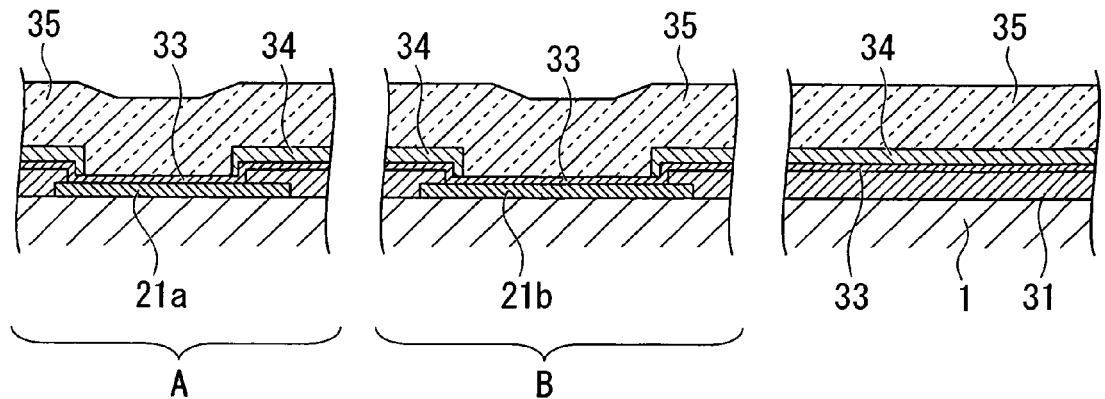
FIG. 10A is a cross-sectional view showing the processing of the via, pad, and projection forming area in a fifth step of manufacturing of the magnetic sensor.

Next, as shown in FIG. 10A, a thick layer of 5 μm thickness composed of silicon oxide is formed in accordance with the plasma CVD method. Details of the thick layer 35 will be described later, but projections 8 are formed therein, so that the thick layer 35 corresponds to the aforementioned embedded layer 11 shown in FIGS. 4 and 8.

Figure 10B:
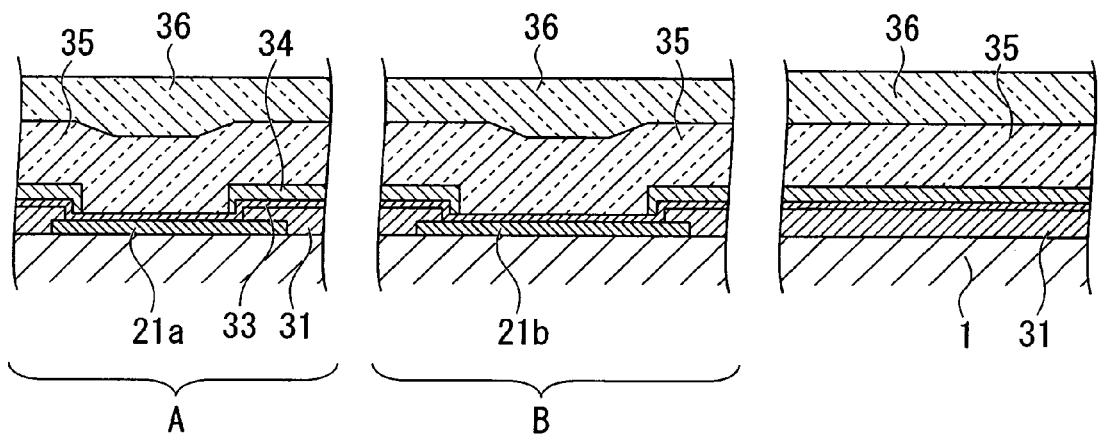
FIG. 10B is a cross-sectional view showing the processing of the via, pad, and projection forming area in a sixth step of manufacturing of the magnetic sensor.

Next, as shown in FIG. 10B, a resist layer 36 of approximately 3 μm thickness is formed to entirely cover the overall surface of the thick layer 35. The resist layer 36 is partially removed by etching so as to form a resist pattern. This allows prescribed portions of a projection forming area C to be exposed with respect to projections; that is, the resist layer 36 covering areas other than the projection forming area C is removed.

Figure 10C:
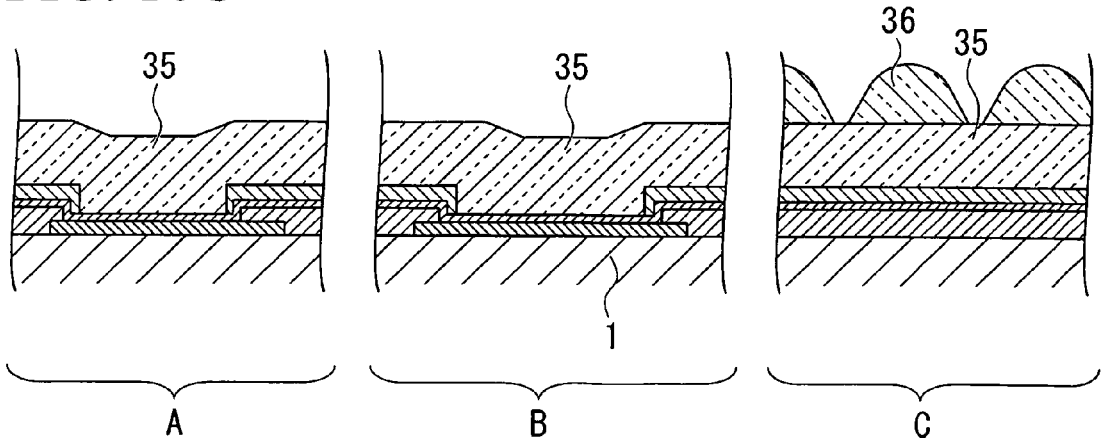
FIG. 10C is a cross-sectional view showing the processing of the via, pad, and projection forming area in a seventh step of manufacturing of the magnetic sensor.

FIG. 10C shows that the "remaining" resist layer 36 is subjected to heat treatment for ten minutes or so at a temperature of 150° C. and is thus melted. Due to the heat treatment, the resist layer 36 is melted so as to cause surface tension due to melting, by which the surface of the resist layer 36 is partially swelled so as to form slopes on terminal ends thereof. In particular, in the projection forming area C, elongated projections are formed in the resist layer 36, and the height thereof may reaches 5 μm or so.

Thereafter, the resist layer 36 and the thick layer 35 are subjected to dry etching in accordance with an etching ratio of 1:1 with respect to resist and silicon oxide.

The dry etching is performed using an etching gas that is a mixed gas composed of $CF_4$, $CHF_3$, $N_2$, and $O_2$ with a ratio of 60/180/10/100 sccm under prescribed conditions, i.e., pressure of 400 m torr (53.2 Pa), RF power of 750 W, electrode temperature of 15° C., and chamber temperature of 15° C., for example.

Figure 11A:
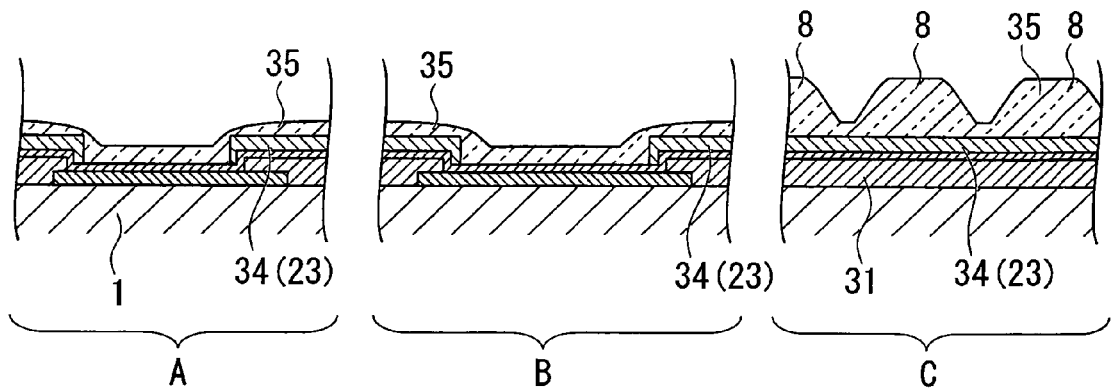
FIG. 11A is a cross-sectional view showing the processing of the via, pad, and projection forming area in an eighth step of manufacturing of the magnetic sensor.

In the dry etching, as shown in FIG. 11A, the thick layer 35 of about 500 nm remains with respect to the other area except areas of projections, thus forming the aforementioned embedded layer 11, wherein the via A and the pad B are respectively exposed with prescribed dimensions not greater than dimensions of an opening the passivation layer 32.

Thereafter, the resist layer 36 remaining on the thick layer 35 is removed.

Thus, as shown in FIG. 11A, plural projections 8 are formed in the projection forming area C of the thick layer 35, wherein the other area is reduced in thickness to 500 nm or so.

Figure 11B:
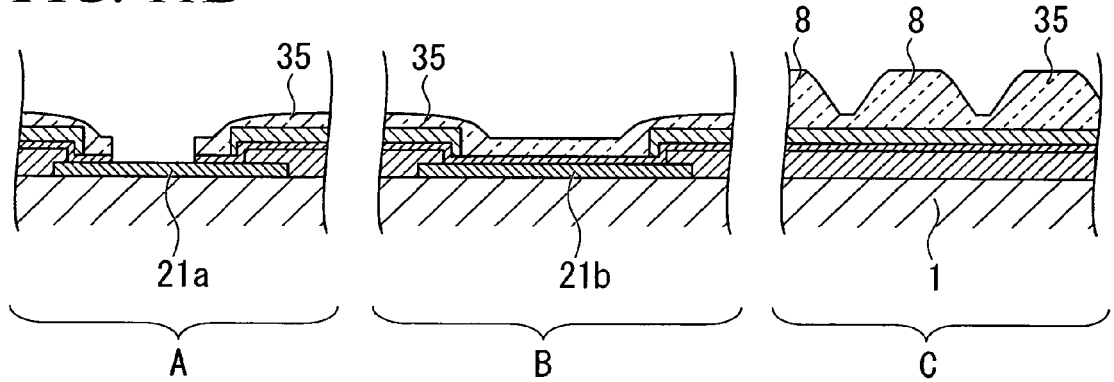
FIG. 11B is a cross-sectional view showing the processing of the via, pad, and projection forming area in a ninth step of manufacturing of the magnetic sensor.

As shown in FIG. 11B, the thick layer 35 and the silicon oxide film 33 covering the conductive portion 21a of the via A are removed, so that the conductive portion 21a is exposed.

Figure 11C:
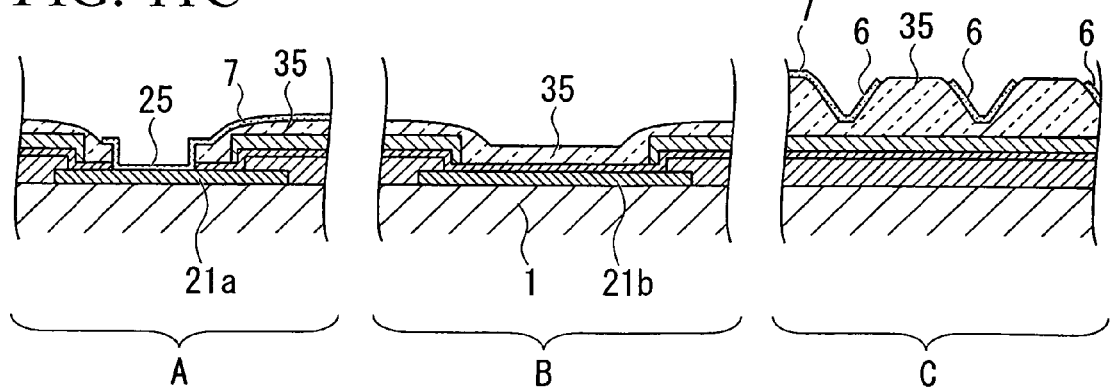
FIG. 11C is a cross-sectional view showing the processing of the via, pad, and projection forming area in a tenth step of manufacturing of the magnetic sensor.

Next, a magnet film is formed on the overall surface of the substrate 1 by sputtering so as to form bias magnets 6 of giant magnetoresistive elements; then, unnecessary portions are removed by resist work and etching. Thus, as shown in FIG. 11C, the bias magnets 6 are formed on the slopes of the projections 8. At the same time, a wiring layer 25 is formed on the conductive portion 21a of the via A; and a wiring layer 7 is formed to establish connection between the wiring layer 25 and the bias magnets 6 of giant magnetoresistive elements.

The aforementioned magnet film is a multi-layered thin metal film composed of Co—Cr—Pt, for example.

In addition, other bias magnets 6 and other wiring layers 7 for use in giant magnetoresistive elements forming the X-axis sensor 2 and Y-axis sensor 3 are formed on the planar surface of the thick layer 35.

In order to adequately perform etching on the magnet film with respect to the slopes of the projections in the resist work that is performed to form the bias magnets 6, it is preferable that the resist film after the formation of the resist pattern be subjected to heat treatment so as to make slopes on terminal ends of the resist film.

Next, a giant magnetoresistive film for use in the formation of magneto-sensitive elements 5 of giant magnetoresistive elements is formed to entirely cover the overall surface by sputtering. The giant magnetoresistive film is composed of a multi-layered thin metal film.

Then, the substrate 1 that is processed as described above is set onto a magnet array and is subjected to heat treatment for three to five hours at a prescribed temperature ranging from 260° C. to 290° C., whereby the giant magnetoresistive film is subjected to pinning, details of which will be described later.

Figure 12A:
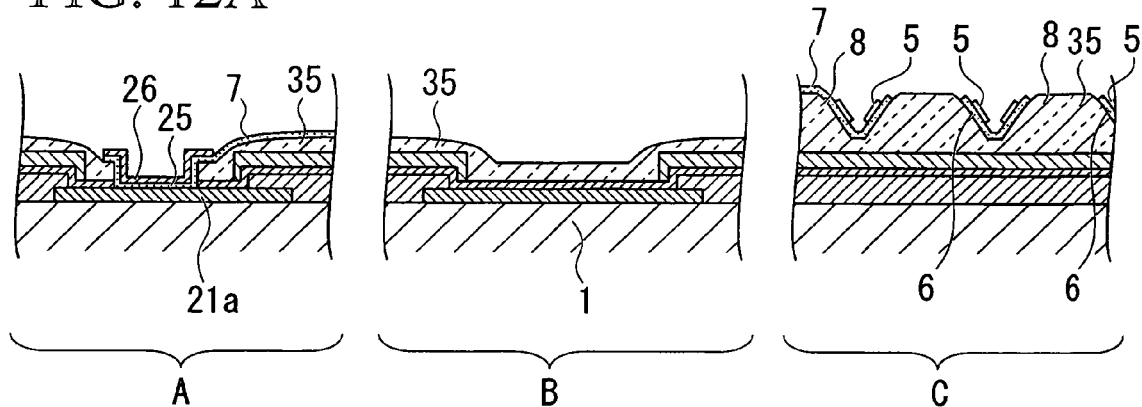
FIG. 12A is a cross-sectional view showing the processing of the via, pad, and projection forming area in an eleventh step of manufacturing of the magnetic sensor.

Thereafter, the giant magnetoresistive film is subjected to resist work and etching so as to remove unnecessary portions thereof. Hence, as shown in FIG. 12A, magneto-sensitive elements 5 are formed on the slopes of the projections 8 in the projection forming area C, thus completing the production of giant magnetoresistive elements with respect to the Z-axis sensor 4.

In the above, a prescribed part of the giant magnetoresistive film is left on the wiring layer 25, which is composed of the magnet film and is previously formed above the conductive portion 21a of the via A, thus making a protective conduction layer 26. Thus, it is possible to produce the aforementioned structure of the via A shown in FIG. 8.

In addition, other magneto-sensitive elements 5 are formed on the planar surface of the "remaining" thick layer 35, thus completing the production of giant magnetoresistive elements with respect to the X-axis sensor 2 and the Y-axis sensor 3.

Figure 12B:
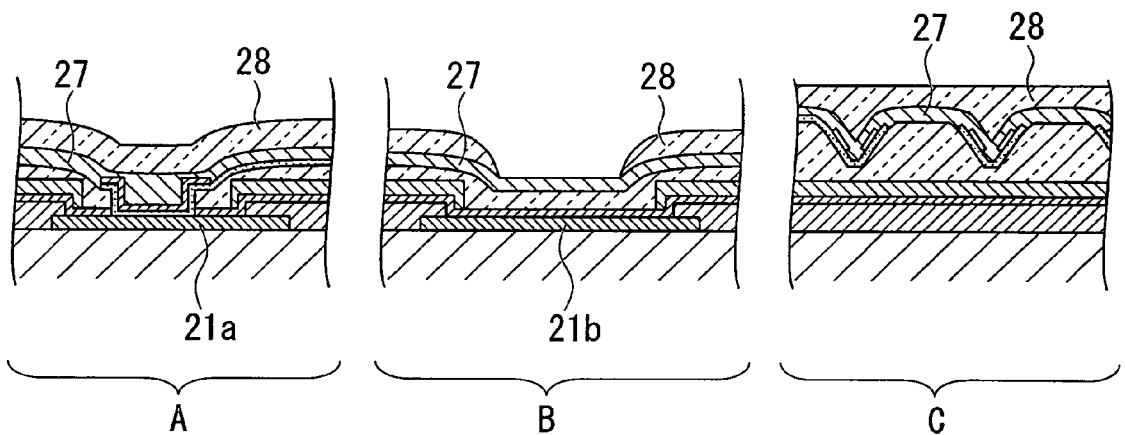
FIG. 12B is a cross-sectional view showing the processing of the via, pad, and projection forming area in a twelfth step of manufacturing of the magnetic sensor.

Next, as shown in FIG. 12B, a passivation layer 27 of about 1 μm thickness composed of silicon nitride is formed in accordance with the plasma CVD method; and a protection layer 28 composed of polyimide is further formed thereon. Prescribed areas of the protection layer 28 and the passivation layer 27 are removed with respect to the pad B, which is thus exposed.

Figure 12C:
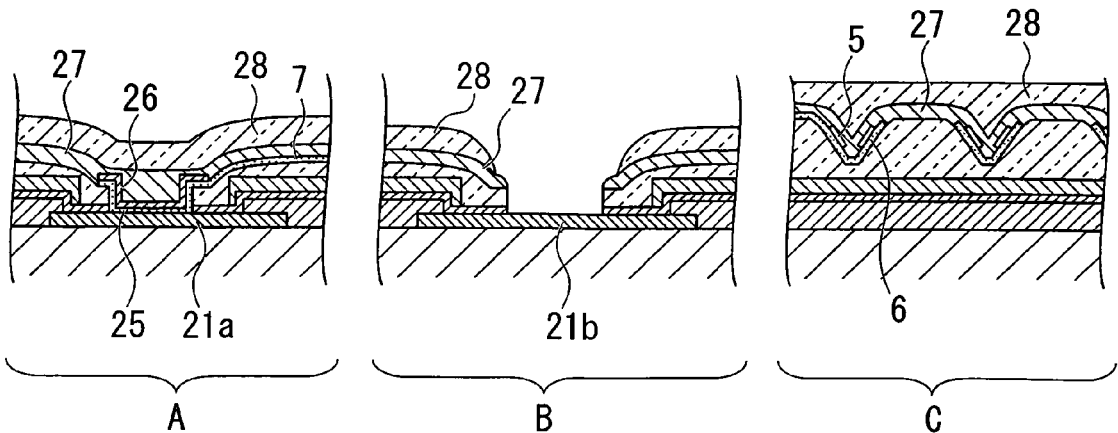
FIG. 12C is a cross-sectional view showing the processing of the via, pad, and projection forming area in a thirteenth step of manufacturing of the magnetic sensor.
Figure 13:
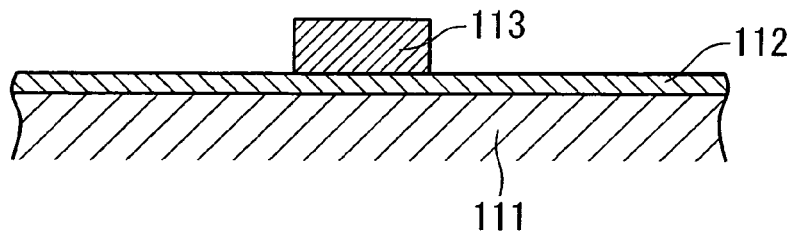
FIG. 13 is a cross-sectional view showing a first step of manufacturing of a magnetic sensor in accordance with a second embodiment of the present invention.

Next, as shown in FIG. 12C, etching is performed using the protection layer 28 as a mask so as to remove the first passivation layer 32 and the thick layer 35 covering the conductive portion 21b of the pad B, so that the conductive portion 21b is exposed. Thus, it is possible to complete manufacturing of a magnetic sensor in accordance with the present embodiment.

Incidentally, it is possible to use other methods for the formation of slopes of elongated projections having linear ridgelines on the substrate 1.

2. Second Embodiment

Next, a manufacturing method for giant magnetoresistive elements on slopes of an elongated projection will be described in accordance with a second embodiment of the present invention with reference to FIGS. 13 to 19. A first insulating layer 112 composed of silicon oxide or silicon nitride is formed on the surface of a substrate 111, wherein the thickness thereof ranges from 50 nm to 100 nm.

A step forming portion 113 is formed at a prescribed position on the first insulating layer 112, which is composed of a metal such as aluminum and aluminum alloy or is composed of an insulating material such as silicon oxide. Specifically, the exterior of the step forming portion 113 is shaped like a rectangular parallelepiped having prescribed dimensions in which height ranges from 1 μm to 3 μm, width ranges from 2 μm to 5 μm, and length ranges from 200 μm to 400 μm.

The step forming portion 113 is formed in such a way that an insulating layer whose thickness ranges from 1 μm to 3 μm is formed using a metal film composed of aluminum or aluminum alloy and silicon oxide, thus forming a thin film, in which unnecessary portions are then removed by way of photolithography and etching.

When the step forming portion 113 is composed of a metal only, it is preferable to additionally form a protection film (not shown) composed of silicon oxide thereon.

Figure 14:
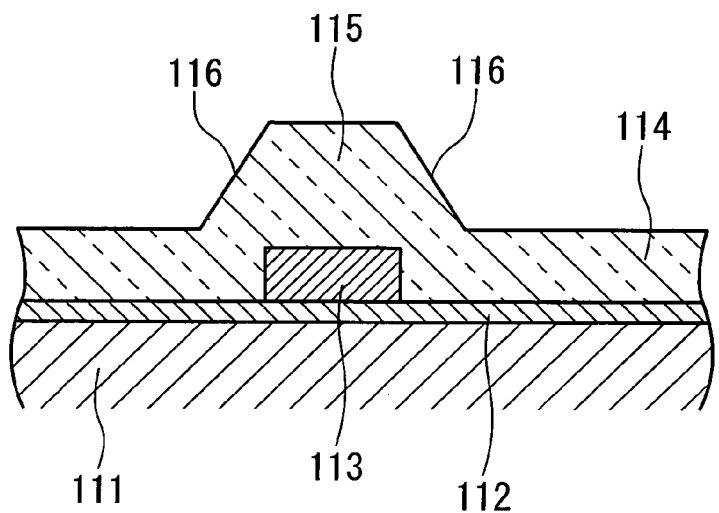
FIG. 14 is a cross-sectional view showing a second step of manufacturing of the magnetic sensor.

Next, as show in FIG. 14, a second insulating layer 114 is deposited to entirely cover the step forming portion 113 on the first insulating layer 112, thus forming an elongated projection 115. The second insulating layer 114 is formed using silicon oxide by way of the high-density plasma CVD method using prescribed materials such as silane and tetraethoxy silane, and the thickness thereof ranges from 3 μm to 8 μm, for example.

In the high-density plasma CVD method, silicon oxide is formed using the prescribed materials at a high density of plasma, e.g., at an electron density ranging from $1 \times 10^9 / cm^3$ to $5 \times 10^{10} / cm^3$; the silicon oxide is subjected to deposition; then, the deposited silicon oxide is subjected to etching using plasma.

By way of the high-density plasma CVD method, deposits of silicon oxide, which are deposited on the step forming portion 113 and are caused to project upwardly from peripheral areas thereof, are subjected to cutting at corners thereof, thus forming slopes.

The high-density plasma CVD method is performed in prescribed conditions, i.e., monosilane flow ranging from 50 sccm to 150 sccm, oxygen flow ranging from 100 sccm to 200 sccm, pressure ranging from 1 Pa to 10 Pa, temperature ranging from 250° C. to 450° C., high-frequency output ranging from 2 kW to 5 kW, and frequency ranging from 10 MHz to 20 MHz.

Due to the formation of the second insulating layer 114, it is possible to form the elongated projection 115 having a trapezoidal shape (defined by slopes 116) in a longitudinal cross section thereof at a prescribed position substantially matching the position of the step forming portion 113. The elongated projection 115 has prescribed dimensions, i.e., height ranging from 3 μm to 5 μm, width of the slope 116 ranging from 5 μm to 20 μm, length ranging from 200 μm to 400 μm, and inclination angle of the slope 116 approximately ranging from 30° to 60°. It is noted that the height be determined in accordance with a prescribed relationship of 5 μm/tan 60°×2+3 μm, whereby in the case of an angle of 60°, the height is 8.8 μm, and in the case of 30°, the height is 20.3 μm.

At all places except the step forming portion 113, a planar insulating layer whose thickness ranging from 3 μm to 5 μm is formed on the substrate 111.

When plural elongated projections 115 are formed on the substrate 111, the bases thereof can be formed to mutually adjoin each other, or the bases thereof can be separated from each other with several micro-meters therebetween.

Figure 15:
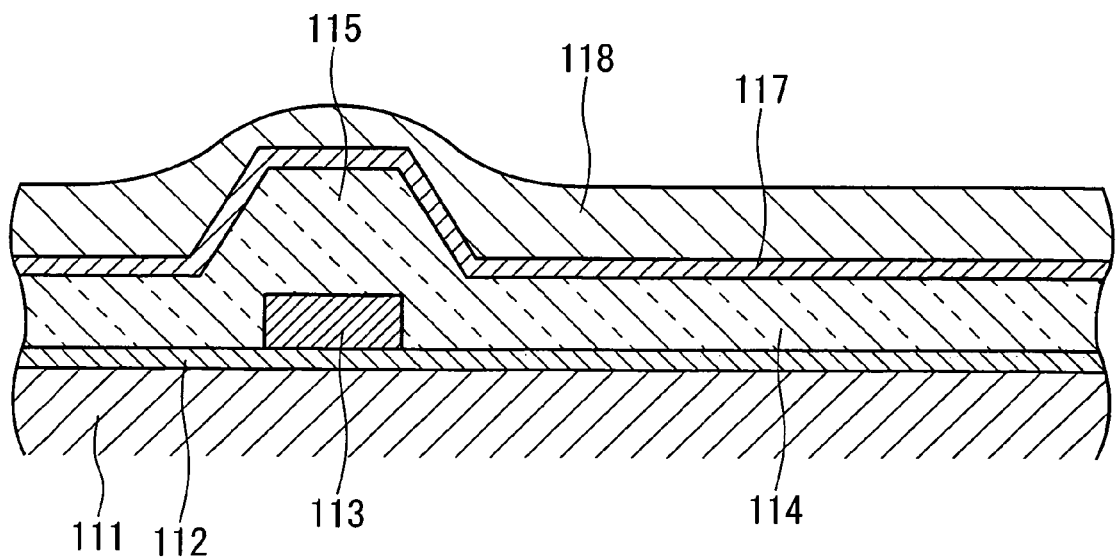
FIG. 15 is a cross-sectional view showing a third step of manufacturing of the magnetic sensor.

Next, as shown in FIG. 15, a giant magnetoresistive film 117 is formed on the second insulating layer 114 so as to entirely cover the elongated projection 115 including the slopes 116. Then, a resist 118 is applied to the giant magnetoresistive film 117. The giant magnetoresistive film 117 is formed by way of sputtering, deposition, and ion plating. The detailed configuration of the giant magnetoresistive film 117 is similar to the foregoing one.

Figure 16:
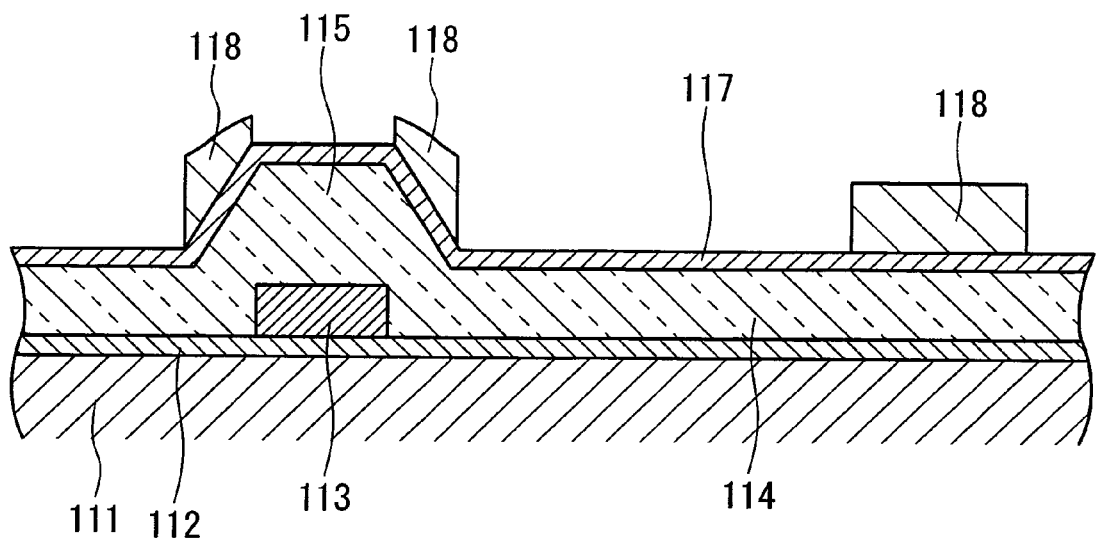
FIG. 16 is a cross-sectional view showing a fourth step of manufacturing of the magnetic sensor.

Next, as shown in FIG. 16, the resist 118 is subjected to exposure and development so that it is removed from the giant magnetoresistive film 117 except at prescribed areas positioned above the slopes 116 of the elongated projection 115. This allows the prescribed areas of the giant magnetoresistive film 117 formed above the slopes 116 of the elongated projection 115 to be covered with the resists 118.

FIG. 16 shows that another area of the giant magnetoresistive film 117, which is formed on the planar surface of the second insulating layer 114 on the substrate 111, is still covered with the resist 118. This makes it possible for an X-axis giant magnetoresistive element and a Y-axis giant magnetoresistive element to be simultaneously formed on the planar surface of the second insulating layer 114.

Figure 17:
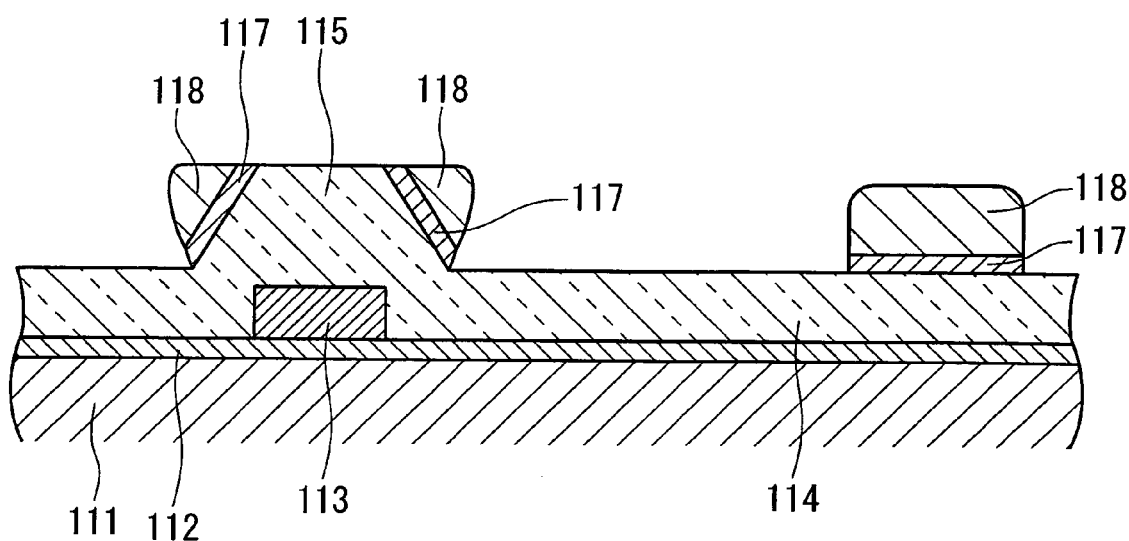
FIG. 17 is a cross-sectional view showing a fifth step of manufacturing of the magnetic sensor.

Next, as shown in FIG. 17, the remaining resists 118 are subjected to heat treatment and are thus varied in shape. In addition, the other areas of the magnetoresistive film 117, which are not covered with the resist 118, are removed by way of milling; then, all the resists 118 remaining on the giant magnetoresistive film 117 are dissolved and removed by use of an organic solvent, for example.

Figure 18:
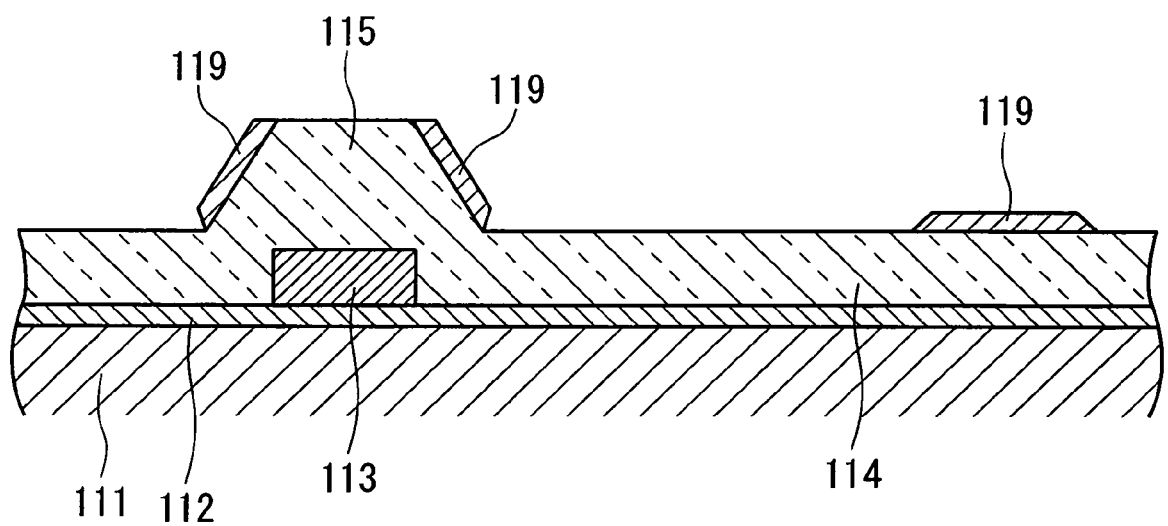
FIG. 18 is a cross-sectional view showing a sixth step of manufacturing of the magnetic sensor.

Thus, as shown in FIG. 18, it is possible to form giant magnetoresistive elements 119 on the slopes 116 of the elongated projection 115. When the resist 118 is still left on the planar surface of the second insulating layer 114 as shown in FIG. 16, it is possible to further form an X-axis giant magnetoresistive element and a Y-axis giant magnetoresistive element thereon.

Then, a protection layer composed of silicon oxide or silicon nitride is formed to entirely cover the aforementioned substrate 111, thus completing the production of a magnetic sensor.

Figure 19:
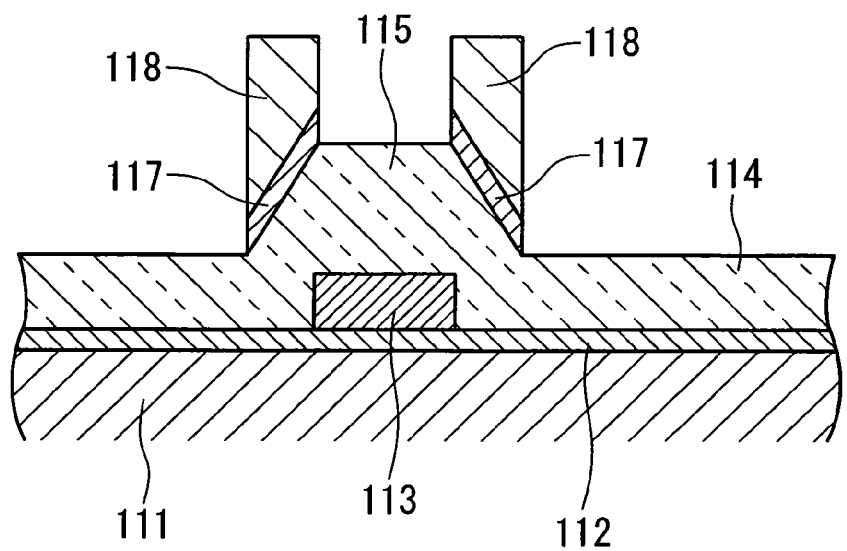
FIG. 19 is a cross-sectional view showing a first modified step in which resists remain on giant magnetoresistive films on slopes of an elongated projection.
Figure 20:
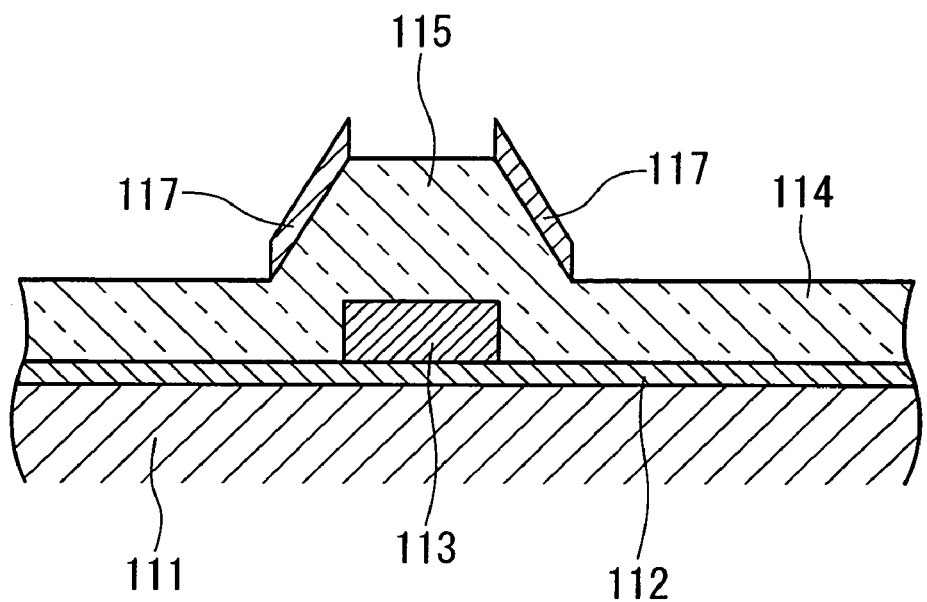
FIG. 20 is a cross-sectional view showing a second modified step in which the resists are removed so that the magnetoresistive films whose upper ends project upwardly remain on the slopes of the elongated projection.

The second embodiment can be modified in a variety of ways. FIGS. 19 and 20 show an example of modification that is basically similar to the second embodiment with regard to the aforementioned steps of manufacturing shown in FIGS. 13 to 16 but differs from the second embodiment with regard to the steps shown in FIGS. 17 and 18.

As shown in FIG. 19, dry etching or anisotropic etching is performed to remove the giant magnetoresistive film 117 except at prescribed areas covered with the resists 118.

Then, the resists 118 left on the prescribed areas of the giant magnetoresistive film 117 are dissolved and removed by use of an organic solvent. In this state, as shown in FIG. 20, the giant magnetoresistive films 117 remain on the slopes 116 of the elongated projection 115, and the upper tip ends thereof are shaped to project upwards from the top portion of the elongated projection 115. Such projecting portions of the remaining giant magnetoresistive films 117 are cut out by way of milling. Thus, it is possible to form the giant magnetoresistive elements 119 on the slopes 116 of the elongated projection 115.

Figure 21:
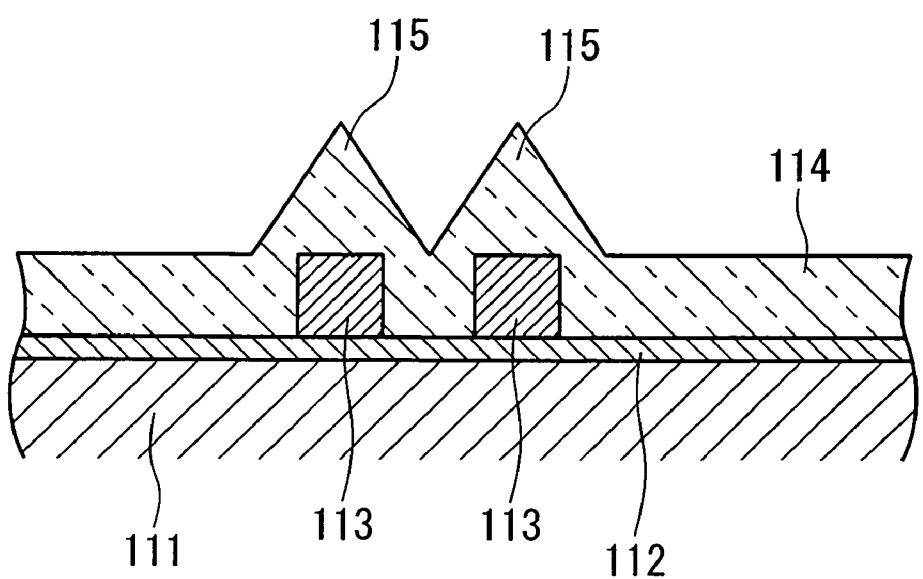
FIG. 21 is a cross-sectional view showing a modified example of a substrate having plural elongated projections for use in manufacturing of a magnetic sensor.

FIG. 21 shows another modification of the second embodiment with respect to the formation of elongated projections.

Specifically, two step forming portions 113 are formed on the first insulating layer 112 above the substrate 111, and they are formed close to each other with a small distance of 5 μm therebetween. Then, the second insulating layer 114 is deposited to entirely cover the two step forming portions 113 on the first insulating layer 112, thus forming two elongated projections 115.

In the above, both the step forming portions 113 have substantially the same height; and the thickness of the second insulating layer 114 substantially matches the height of the step forming portions 113. Specifically, both the aforementioned height and thickness are set to approximately 5 μm. This realizes the formation of the elongated projections 115 each having a triangular shape in a longitudinal cross section thereof, wherein the bases of the elongated projections 115 are formed to be adjacent to each other. This increases a concentration of giant magnetoresistive elements formed on the slopes 116 of the elongated projections 115. That is, it is possible to realize a small-size magnetic sensor.

3. Third Embodiment

Figure 22:
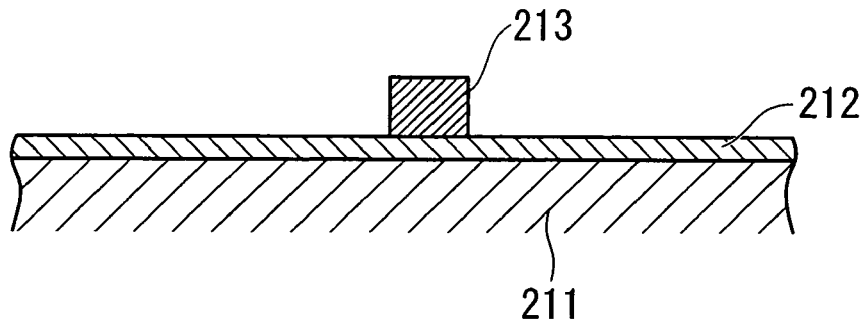
FIG. 22 is a cross-sectional view showing a first step of manufacturing of a magnetic sensor in accordance with a third embodiment of the present invention.

Next, a manufacturing method for giant magnetoresistive elements on slopes of an elongated projection will be described in accordance with a third embodiment of the present invention with reference to FIGS. 22 to 28. As shown in FIG. 22, a first insulating layer 212 is formed on the surface of a substrate 211.

The first insulating layer 212 is composed of silicon oxide or silicon nitride, wherein the thickness thereof ranges from 300 nm to 1500 nm.

A step forming portion 213 composed of a prescribed metal such as aluminum and aluminum alloy is formed to project at a prescribed position on the first insulating layer 112. The step forming portion 213 has a rectangular parallelepiped shape having prescribed dimensions, i.e., height ranging from 1 μm to 5 μm, width ranging from 2 μm to 15 μm, and length ranging from 50 μm to 400 μm.

The step forming portion 213 is formed in such a way that a thin metal film composed of aluminum or aluminum alloy whose thickness ranges from 1 μm to 5 μm is formed on the second insulating layer 212 by way of the thin film forming method such as deposition and sputtering; then, unnecessary portions of the thin metal film are removed by photolithography and etching.

Figure 23:
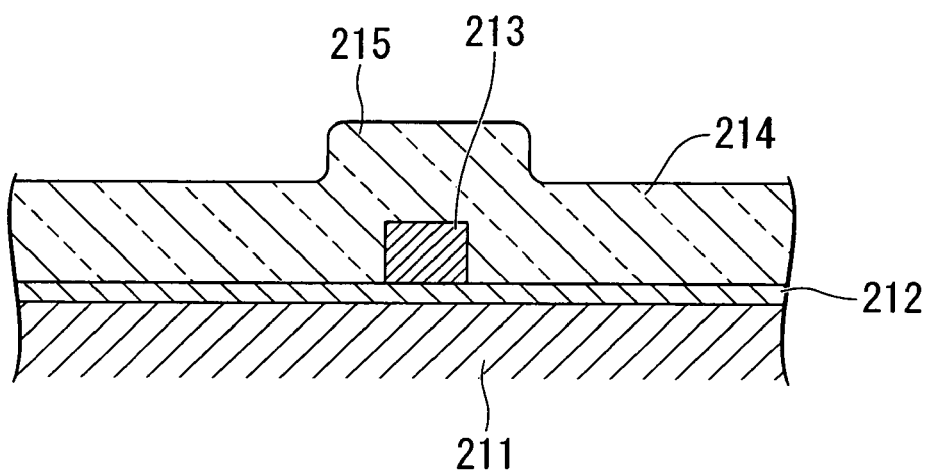
FIG. 23 is a cross-sectional view showing a second step of manufacturing of the magnetic sensor.

Next, as shown in FIG. 23, a second insulating layer 214 is deposited on the first insulating layer 212 so as to entirely cover the step forming portion 213, thus forming a projection 215. The second insulating layer 214 composed of silicon oxide is formed using prescribed material such as silane and tetraethoxy silane by way of the plasma CVD method or ozone CVD method, and the thickness thereof ranges from 3 μm to 5 μm, for example.

Due to the formation of the second insulating layer 214, it is possible to form the projection 215 having substantially the same shape of the step forming portion 213 in conformity with the step forming portion 213 on the first insulating layer 212. The projection 215 has prescribed dimensions, i.e., height ranging from 3 μm to 5 μm, width ranging from 5 μm to 20 μm, and length ranging from 50 μm to 400 μm.

When plural projections are formed on the substrate 211, it is preferable that the distance therebetween be set to 5 μm or more.

Figure 24:
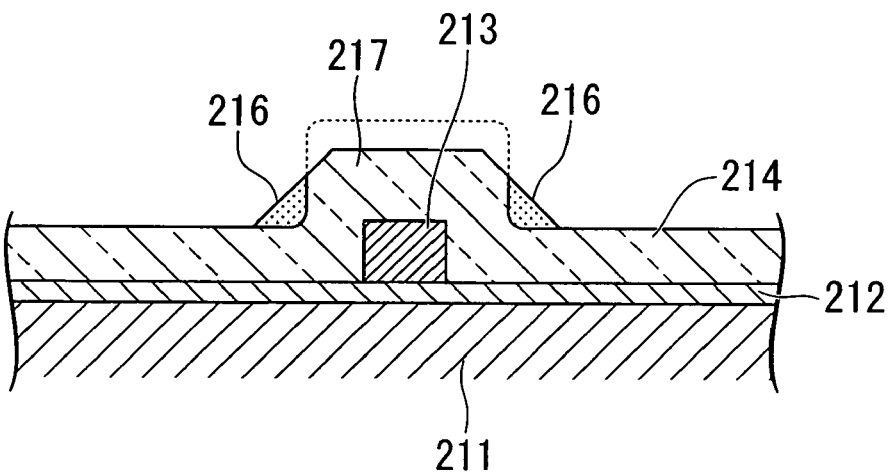
FIG. 24 is a cross-sectional view showing a third step of manufacturing of the magnetic sensor.

Then, the substrate 211 is subjected to plasma etching or microwave etching, so that, as shown in FIG. 24, the upper corners of the projection 215 are subjected to tapered etching, thus producing an elongated projection 217 having slopes 216.

Plasma etching is performed using a plasma device of a parallel-plate type, and in this process, the substrate 211 is rotated and inclined by a prescribed angle ranging from 30° to 60° with respect to an electrode plate, so that etching is performed in the atmosphere of an argon gas, an oxygen gas, or a mixed gas. Specifically, etching is performed in prescribed conditions, i.e., argon flow ranging from 50 sccm to 200 sccm, pressure ranging from 6.7 Pa to 26.7 Pa, high-frequency output ranging from 750 W to 1500 W, and frequency of 13.56 MHz, for example.

Microwave etching is performed using a plasma generation device, wherein a gas is introduced into a silica tube, into which microwaves are supplied from a waveguide, thus generating plasma. Herein, etching is performed in the atmosphere of an argon gas, an oxygen gas, or a mixed gas. Specifically, etching is performed in prescribed conditions, i.e., oxygen flow ranging from 50 sccm to 200 sccm, pressure ranging from 6.7 Pa to 13.3 Pa, microwave ranging from 0.1 A to 0.5 A, frequency of 2.45 GHz, and RF power ranging from 100 W to 200 W (at 13.56 MHz), for example.

Due to the aforementioned etching, the upper corners of the projection 215 formed by the second insulating layer 214 are cut out; then, silicon oxide being cut out is adhered to lower portions of the projection 215, thus forming the slopes 216 as shown in FIG. 24. An inclination angle of the slope 216 ranges from 30° to 60° and is preferably set to 45°; and the width of the slope 216 ranges from 5 μm to 20 μm, for example.

Figure 25:
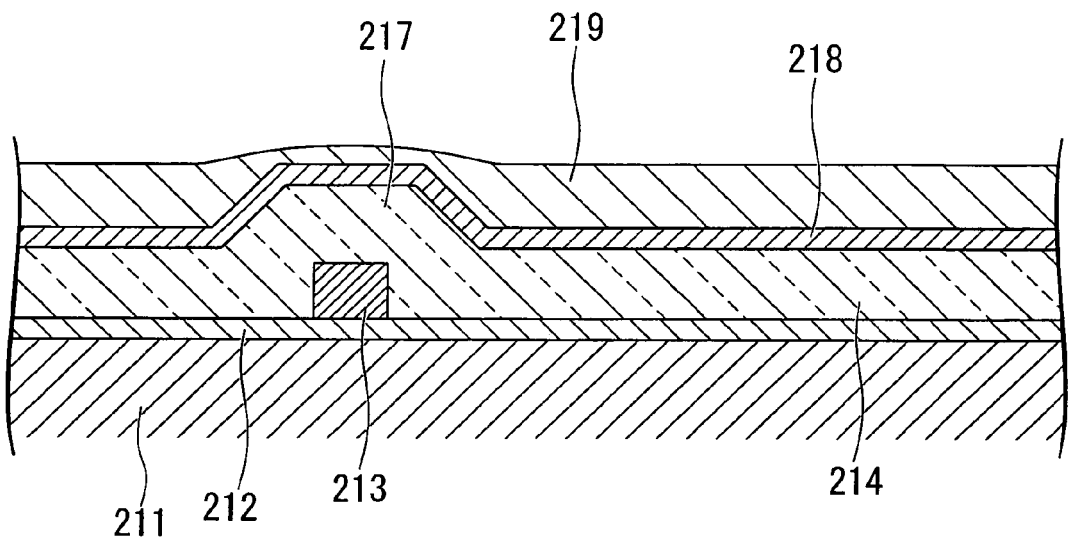
FIG. 25 is a cross-sectional view showing a fourth step of manufacturing of the magnetic sensor.

Next, as shown in FIG. 25, a giant magnetoresistive film 218 is formed on the second insulating layer 214 so as to entirely cover the slopes 216 of the elongated projection 217. Then, a resist 219 is applied onto the giant magnetoresistive film 218. The giant magnetoresistive film 218 is formed by way of sputtering, deposition, or ion plating. The detailed configuration of the giant magnetoresistive film 218 is similar to the foregoing one.

Figure 26:
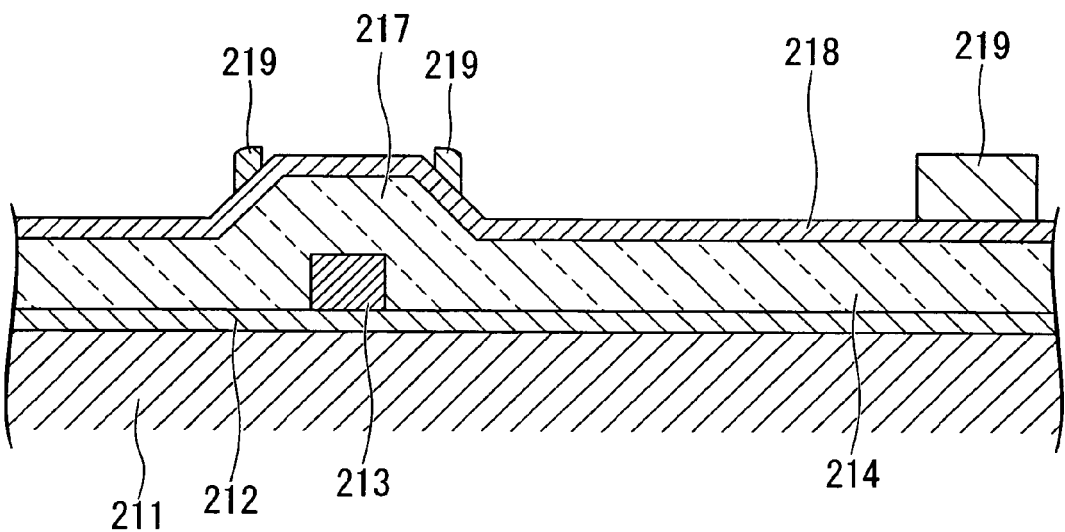
FIG. 26 is a cross-sectional view showing a fifth step of manufacturing of the magnetic sensor.

Next, as shown in FIG. 26, the resist 219 is subjected to exposure and development and is thus removed from the giant magnetoresistive film 218 except at prescribed areas on the slopes 216 of the elongated projection 217. Thus, the giant magnetoresistive film 218 is partially covered with resists 219 on the slopes 216 of the elongated projection 217.

In the above, the thickness of the resist 219, which remains on the giant magnetoresistive film 217 and which is measured at the upper end of the slope 216 close to the top portion of the elongated projection 217, is adjusted in such a way that a distance ranging from the base portion of the giant magnetoresistive film 218 to the top portion of the resist 219 ranges from 1.0 μm to 2.0 μm and is preferably set to 1.5 μm, for example.

In addition, another resist 219 remains on a prescribed area of the giant magnetoresistive film 218 formed on the planar surface of the second insulating layer 214 on the substrate 211. This makes it possible to simultaneously form an X-axis giant magnetoresistive element and a Y-axis giant magnetoresistive element on the planar surface of the second insulating layer 214.

Figure 27:
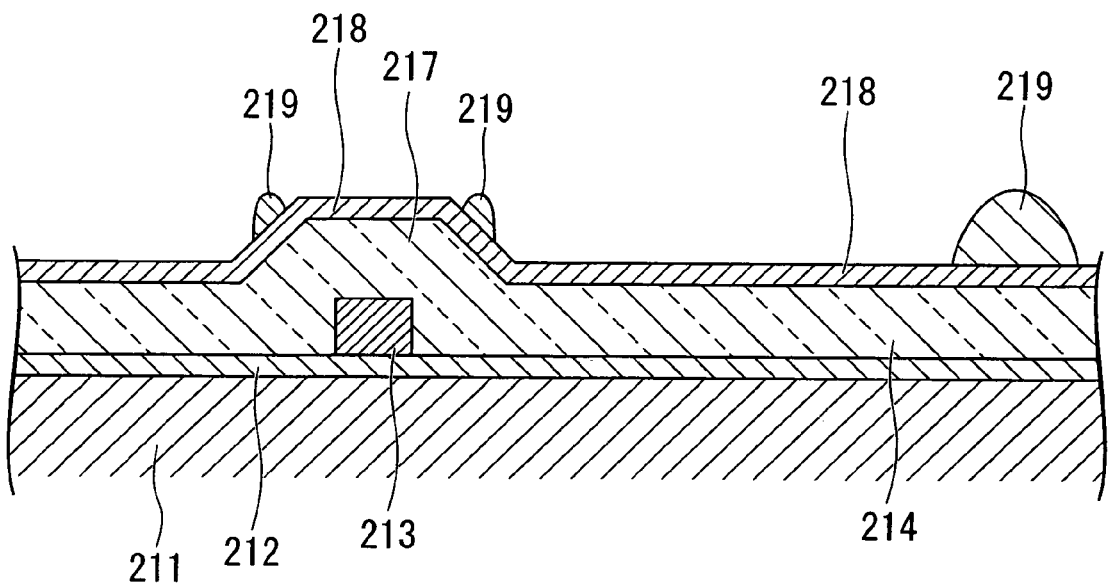
FIG. 27 is a cross-sectional view showing a sixth step of manufacturing of the magnetic sensor.
Figure 28:
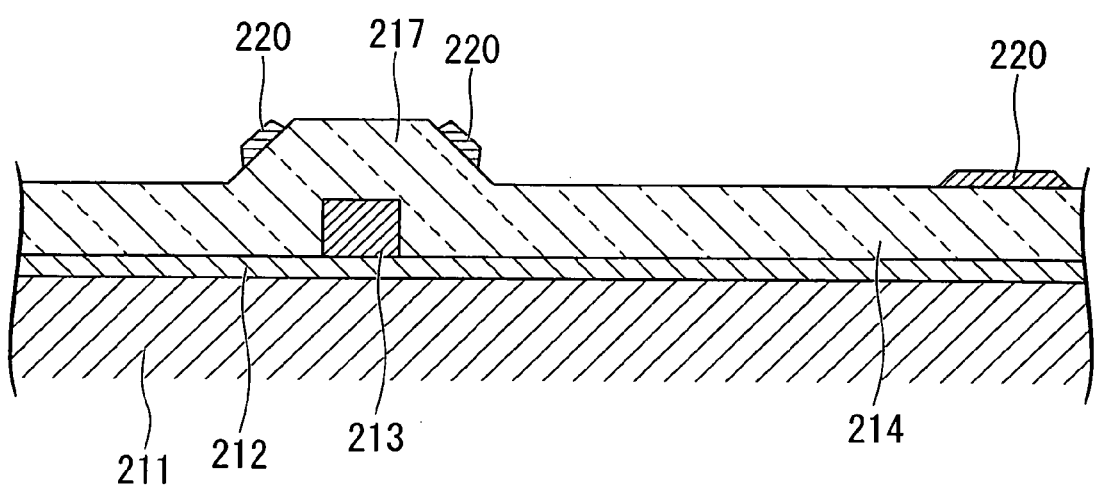
FIG. 28 is a cross-sectional view showing a seventh step of manufacturing of the magnetic sensor.

Next, as shown in FIG. 27, the remaining resists 219 are subjected to heat treatment and thus varied in shape. The other portion of the giant magnetoresistive film 218, which is not covered with the resist 219, is subjected to milling and is thus removed. In addition, all the resists 219 remaining on the giant magnetoresistive film 218 are dissolved and removed by use of an organic solvent.

Thus, it is possible to form giant magnetoresistive elements 220 in the middle areas of the slopes 216 of the elongated projection 217. When the resist 219 is left on the planar surface of the second insulating layer 214 as shown in FIG. 26, it is possible to form an X-axis giant magnetoresistive element and a Y-axis giant magnetoresistive element thereon.

Figure 29:
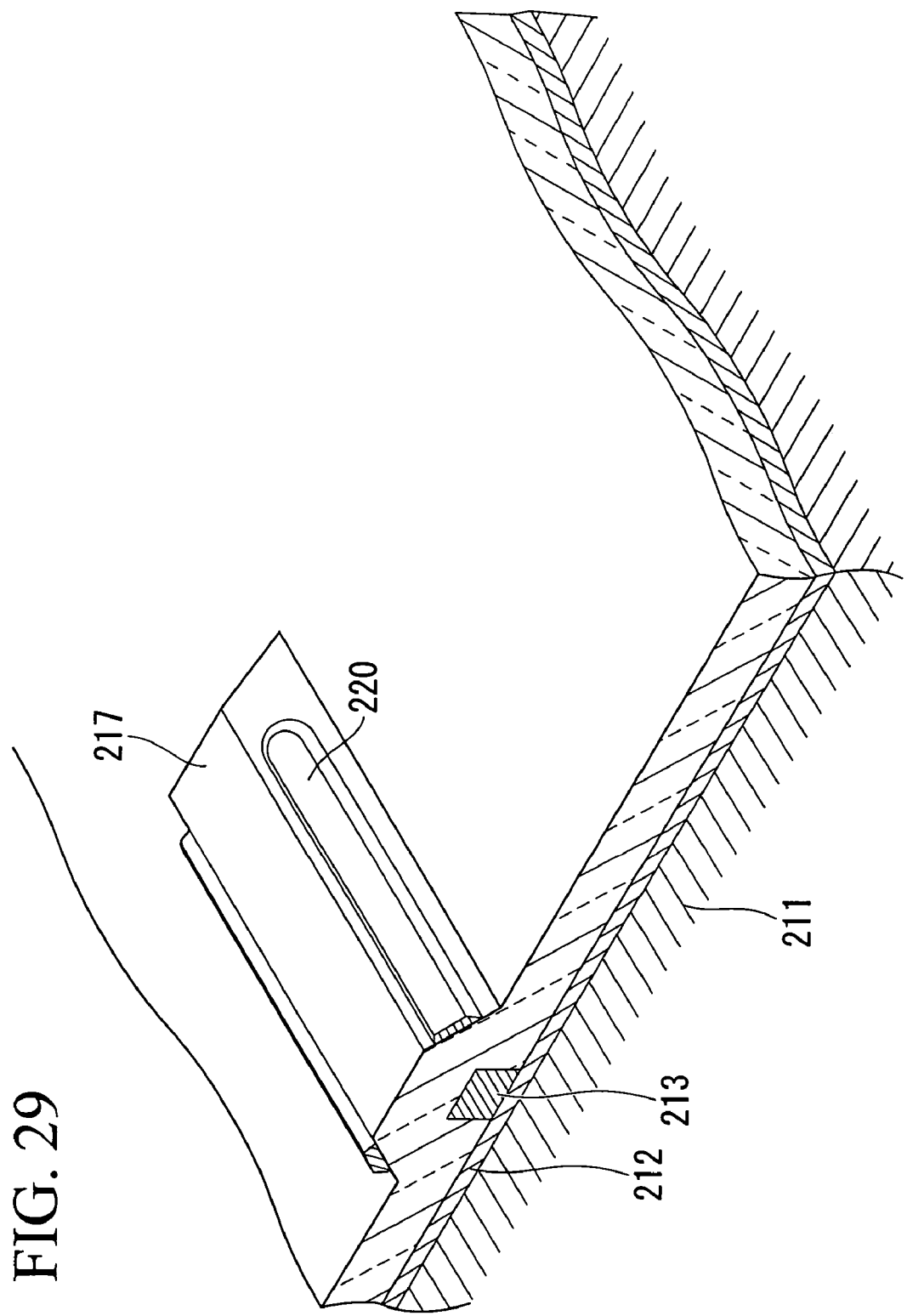
FIG. 29 is a perspective view showing magnetoresistive elements formed on slopes of an elongated projection on a substrate.

FIG. 29 is a perspective view showing the giant magnetoresistive elements 220 formed on the middle areas of the slopes 216 of the elongated projection 217. Herein, the terminal end of the giant magnetoresistive element 220 lying in its longitudinal direction is rounded in shape.

Thereafter, a protection layer composed of silicon oxide or silicon nitride is further formed to entirely cover the substrate 211, thus completing the production of a magnetic sensor in accordance with the third embodiment.

Figure 30:
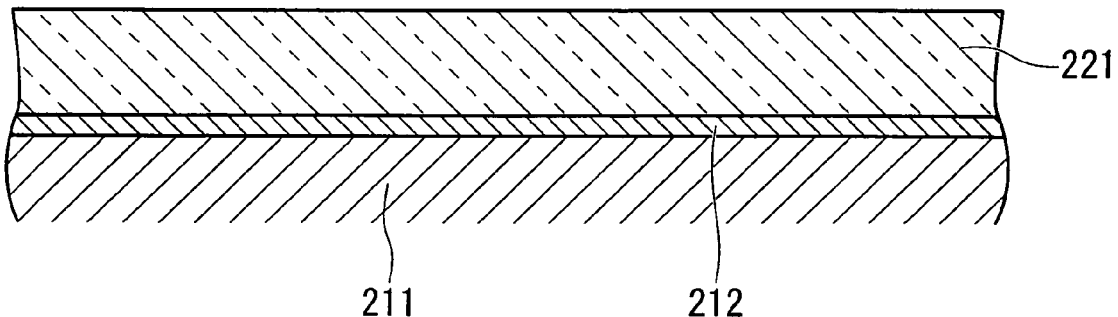
FIG. 30 is a cross-sectional view showing a first modified step in which insulating layers are formed on a substrate.
Figure 31:
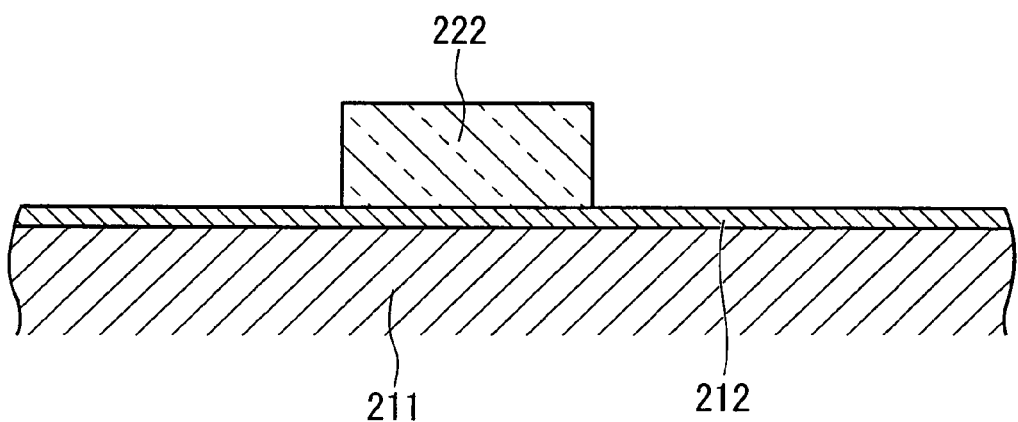
FIG. 31 is a cross-sectional view showing a second modified step in which a projection is formed on the substrate.
Figure 32:
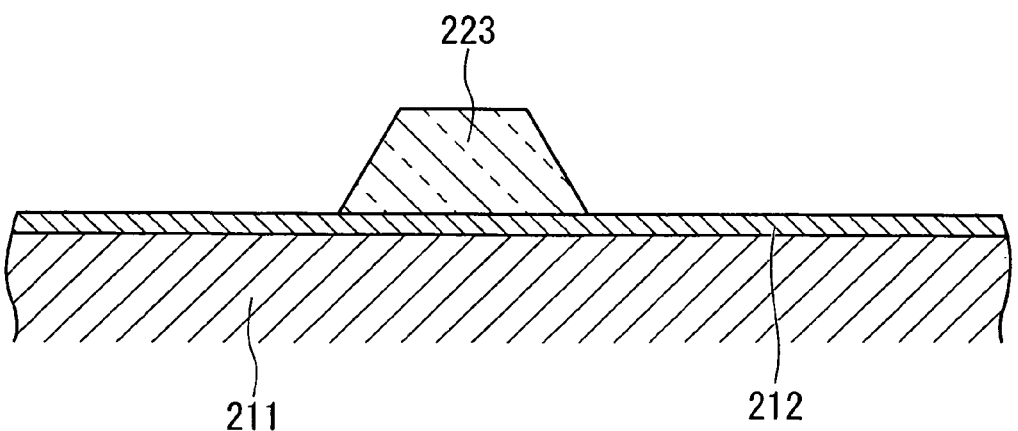
FIG. 32 is a cross-sectional view showing a third modified step in which an elongated projection is formed on the substrate.

FIGS. 30 to 32 show a modification of the formation of an elongated projection in the present embodiment.

First, as shown in FIG. 30, a third insulating layer 221 composed of silicon oxide is formed on the first insulating layer 212 above the substrate 211. The third insulating layer 221 composed of silicon oxide is formed using prescribed materials such as silane and tetraethoxy silane by way of the plasma CVD method or ozone CVD method, and the thickness thereof ranges from 3 μm to 8 μm.

Then, the third insulating layer 221 is subjected to etching, thus forming a projection 222 (see FIG. 31), which is shaped similar to the aforementioned projection 215. The projection 222 has prescribed dimensions, i.e., height ranging from 3 μm to 8 μm, width ranging from 5 μm to 20 μm, and length ranging from 50 μm to 400 μm. When plural projections each corresponding to the projection 222 are formed on the substrate 211, the distance therebetween should be set to 5 μm or more.

The projection 222 is subjected to plasma etching or microwave etching, so that the upper corners of the projection 222 are subjected to tapered etching, whereby the projection 222 is processed into an elongated projection 223 as shown in FIG. 32.

Thereafter, in accordance with the aforementioned steps, giant magnetoresistive elements are formed on the slopes of the elongated projection 223.

The aforementioned modification eliminates the necessity of forming the second insulating layer 214 on the step forming portion 213 composed of aluminum or aluminum alloy. This reduces the number of steps in manufacturing. Since the second insulating layer 214 does not exist on the planar surface of the substrate 211, it is possible to reduce stress applied to the substrate 211.

Next, pinning of giant magnetoresistive elements will be described with reference to FIGS. 33A, 33B, 33C, and 34 in relation to the first embodiment, wherein a magnet array having magnets is arranged above the substrate 1. Specifically, the magnet array is positioned just above the surface of the substrate 1 in which giant magnetoresistive elements are formed.

Figure 33A:
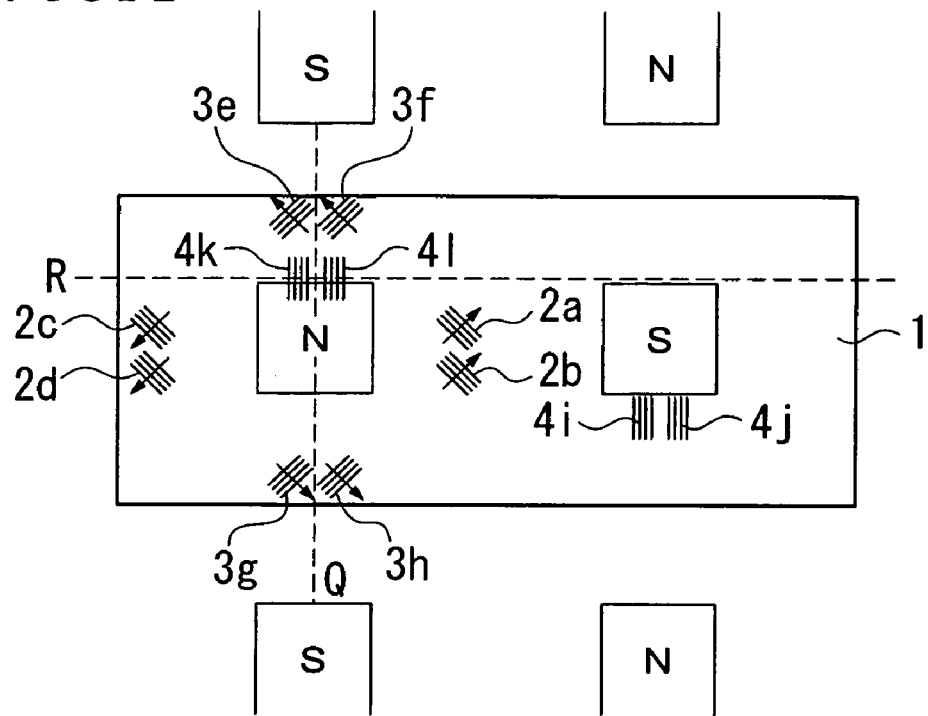
FIG. 33A shows a positional relationship between magnets and giant magnetoresistive elements formed on the surface of a substrate according to the first embodiment in terms of polarities.

FIG. 33A shows a positional relationship between magnets and giant magnetoresistive elements formed on the surface of the substrate 1 in terms of polarities, wherein polarities S and N of the magnets are set in connection with the surface of the substrate 1.

Figure 33B:
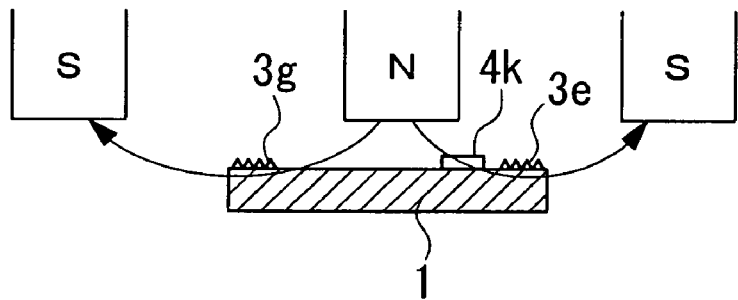
FIG. 33B shows a positional relationship between magnets and giant magnetoresistive elements in terms of polarities in a cross section taken along line Q in FIG. 33A.

FIG. 33B shows a positional relationship between the magnets and the giant magnetoresistive elements in terms of polarities with respect to a cross section taken along a dotted line Q.

Figure 33C:
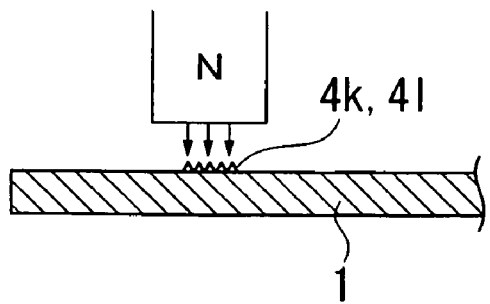
FIG. 33C shows a positional relationship between a magnet and a giant magnetoresistive element in terms of polarity in a cross section taken along line R in FIG. 33A.

FIG. 33C shows a positional relationship between a magnet and a giant magnetoresistive element in terms of polarity with respect to a cross section taken along a dotted line R.

Figure 34:
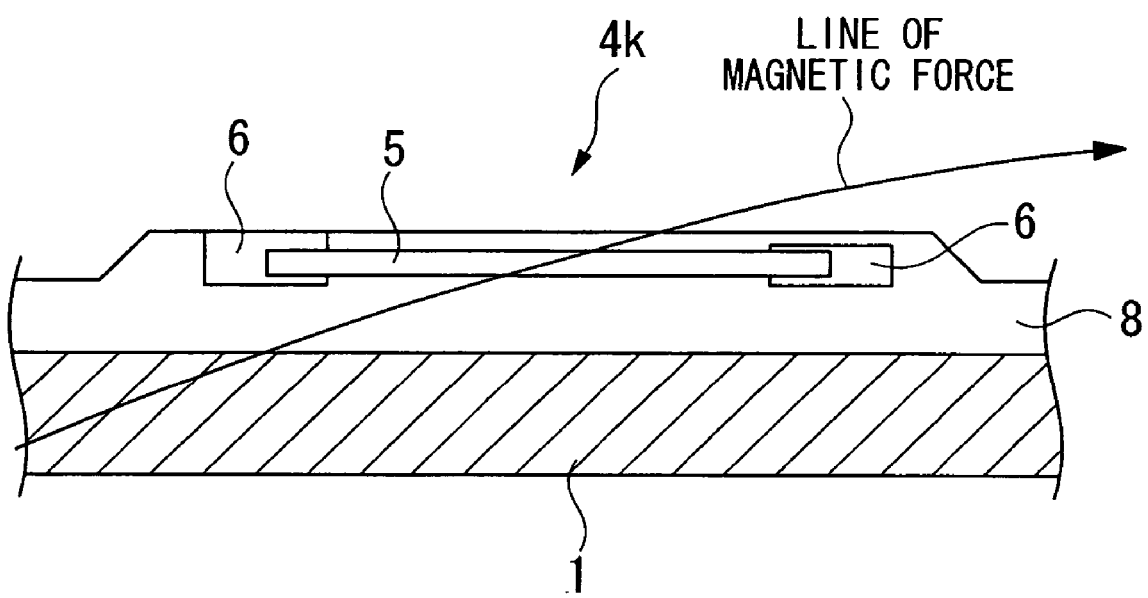
FIG. 34 is an enlarged cross-sectional view corresponding to FIG. 33B, which shows a direction of a line of magnetic force applied to a single giant magnetoresistive element.

FIG. 34 is an enlarged cross-sectional view corresponding to FIG. 33B, which shows a direction of a line of magnetic force applied to a single giant magnetoresistive element.

In the aforementioned manufacturing method for a magnetic sensor according to the first embodiment, it is possible to incorporate the X-axis sensor 2, Y-axis sensor 3, and Z-axis sensor 4 into a single substrate 1, in which vias and pads can be simultaneously formed; hence, it is possible to produce a small-size three axial magnetic sensor by way of a series of steps within a short period of time.

Lastly, the present invention is not necessarily limited to the aforementioned embodiments, which are illustrative and not restrictive; hence, any modification and design change falling within the scope of the invention is intended to be embraced by the appended claims.

What is claimed is:

1. A manufacturing method for a magnetic sensor, comprising the steps of:
   forming a thick layer on a substrate;
   forming a resist layer on the thick layer;
   removing a prescribed part of the resist layer, to leave a plurality of resist portions;
   subjecting the plurality of resist portions to heat treatment, thus forming slopes on the terminal ends of the plurality of resist portions and forming valleys between adjacent ones of the plurality of resist portions;
   etching the plurality of resist portions and the thick layer with a ratio of 1:1, thus forming elongated projections having slopes and linear ridgelines; and
   forming a plurality of magneto-sensitive elements on a planar surface of the thick layer and on the slopes of the elongated projections.

2. A manufacturing method for a magnetic sensor, comprising the steps of:
   forming a planation layer so as to entirely cover an uppermost wiring layer of a substrate;
   forming a passivation layer on the planation layer;
   forming a thick layer on the planation layer;
   forming a resist layer on the thick layer;
   removing a prescribed part of the resist layer;
   subjecting a remaining part of the resist layer to heat treatment, thus forming slopes;
   etching the remaining part of the resist layer and the thick layer with a ratio of 1:1, thus forming an elongated projection having a linear ridgeline;
   forming a bias magnet film to cover a planar surface of the thick layer and the slopes of the elongated projection as well as its bottom and top portions;
   forming a giant magnetoresistive film on the bias magnet film;
   subjecting the substrate, which is placed on a magnet array, to heat treatment;
   removing a prescribed part of the giant magnetoresistive film by way of etching;
   forming a plurality of magneto-sensitive elements on the planar surface of the thick layer and the slopes of the elongated projection respectively; and
   further forming a protection layer.

3. A manufacturing method for a magnetic sensor, comprising the steps of:
   forming a planation layer to cover an uppermost wiring layer on a substrate;
   removing a prescribed part of the planation layer so as to expose at least one via and at least one pad;
   forming a passivation layer including an upper layer and a lower layer;
   removing the upper layer with respect to the at least one via and the at least one pad;
   forming a thick layer;
   forming a resist layer;
   removing a prescribed part of the resist layer;
   subjecting a remaining part of the resist layer to heat treatment, thus forming slopes;
   etching the remaining part of the resist layer and the thick layer with a ratio of 1:1, thus forming an elongated projection having a linear ridgeline, while the thick layer, which is reduced in thickness, remains in the at least one via and the at least one pad;
   removing the thick layer and the lower layer of the passivation layer from the via, thus exposing a conductive portion of the via;
   forming a bias magnet film to cover a planar surface of the thick layer and the slopes of the elongated projection as well as its top and bottom portions;
   forming a wiring layer so as to establish an electric connection between the bias magnet film and the conductive portion of the via;
   forming a giant magnetoresistive film in connection with the bias magnet film;
   subjecting the substrate, which is placed on a magnet array, to heat treatment;
   removing a prescribed part of the giant magnetoresistive film by way of etching, thus forming a plurality of magneto-sensitive elements on the planar surface of the thick layer and the slopes of the elongated projection, wherein the giant magnetoresistive film still remains in the via;
   forming a protection layer to entirely cover the substrate except at the pad; and
   removing the thick layer covering the pad and the lower layer of the passivation layer, thus exposing a conductive portion of the at least one pad.

* * * * *